(12) United States Patent
Ling

(10) Patent No.: US 8,989,088 B2
(45) Date of Patent: *Mar. 24, 2015

(54) OFDM SIGNAL PROCESSING IN A BASE TRANSCEIVER SYSTEM

(75) Inventor: Yi Ling, Redwood City, CA (US)

(73) Assignee: Integrated Device Technology Inc., San Jose, CA (US)

(*) Notice: Subject to any disclaimer, the term of this patent is extended or adjusted under 35 U.S.C. 154(b) by 407 days.

This patent is subject to a terminal disclaimer.

(21) Appl. No.: 13/476,862

(22) Filed: May 21, 2012

(65) Prior Publication Data

US 2012/0250740 A1    Oct. 4, 2012

Related U.S. Application Data

(63) Continuation-in-part of application No. 13/343,636, filed on Jan. 4, 2012.

(60) Provisional application No. 61/430,901, filed on Jan. 7, 2011.

(51) Int. Cl.
*H04W 4/00* (2009.01)
*H04J 11/00* (2006.01)
(Continued)

(52) U.S. Cl.
CPC .............. *H04W 88/085* (2013.01); *H03M 7/30* (2013.01); *H04L 27/265* (2013.01); *H04L 27/2607* (2013.01)
USPC .......................................... 370/328; 370/210

(58) Field of Classification Search
None
See application file for complete search history.

(56) References Cited

U.S. PATENT DOCUMENTS 5,999,561 A    12/1999    Naden et al.
6,192,259 B1    2/2001    Hayashi
(Continued)

FOREIGN PATENT DOCUMENTS

KR    20080056360    6/2008
WO    2005/048625    5/2005
(Continued)

OTHER PUBLICATIONS

International Preliminary Report on Patentability, issued on Nov. 23, 2010, for application PCT/US2009044553.
(Continued)

*Primary Examiner* — Jutai Kao
(74) *Attorney, Agent, or Firm* — Kenneth Glass; Molly Sauter; Glass & Associates

(57) ABSTRACT

A method and apparatus provides OFDM signal compression for transfer over serial data links in a base transceiver system (BTS) of a wireless communication network. For the uplink, an RF unit of the BTS applies OFDM cyclic prefix removal and OFDM frequency transformation of the baseband signal samples followed by frequency domain compression of the baseband signal samples, resulting from analog to digital conversion of received analog signals followed by digital downconversion, forming compressed coefficients. After transfer over the serial data link, the baseband processor applies frequency domain decompression to the compressed coefficients prior to further signal processing. For the downlink, the RF unit performs frequency domain decompression of the compressed coefficients and applies OFDM inverse frequency transformation of the decompressed coefficients and OFDM cyclic prefix insertion prior to digital upconversion and digital to analog conversion, generating the analog signal for transmission over the antenna.

37 Claims, 20 Drawing Sheets

(51) Int. Cl.
*H04W 88/08* (2009.01)
*H03M 7/30* (2006.01)
*H04L 27/26* (2006.01)

(56) References Cited

U.S. PATENT DOCUMENTS

| | | | |
|---|---|---|---|
| 6,226,325 B1 | 5/2001 | Nakamura |
| 6,263,503 B1 | 7/2001 | Margulis |
| 6,449,596 B1 | 9/2002 | Ejima |
| 6,842,623 B2 | 1/2005 | Koscal |
| 7,009,533 B1 | 3/2006 | Wegener |
| 7,088,276 B1 | 8/2006 | Wegener |
| 7,142,519 B2 | 11/2006 | Saadeh et al. |
| 7,623,894 B2 | 11/2009 | Vaglica et al. |
| 7,656,897 B2 | 2/2010 | Liu |
| 7,680,149 B2 | 3/2010 | Liu et al. |
| 7,706,477 B2 | 4/2010 | Larsson |
| 7,835,435 B2 | 11/2010 | Soni et al. |
| 7,852,797 B2 | 12/2010 | Kang et al. |
| 7,899,410 B2 | 3/2011 | Rakshani et al. |
| 7,961,807 B2 | 6/2011 | Kotecha et al. |
| 8,005,152 B2 | 8/2011 | Wegener |
| 8,089,854 B2 | 1/2012 | Persico |
| 8,174,428 B2 | 5/2012 | Wegener |
| 2002/0055371 A1 | 5/2002 | Arnon et al. |
| 2003/0100286 A1 | 5/2003 | Severson et al. |
| 2004/0004943 A1 | 1/2004 | Kim et al. |
| 2004/0062392 A1 | 4/2004 | Morton |
| 2004/0082365 A1 | 4/2004 | Sabach et al. |
| 2004/0198237 A1 | 10/2004 | Abutaleb et al. |
| 2005/0104753 A1 | 5/2005 | Dror et al. |
| 2005/0105552 A1 | 5/2005 | Osterling |
| 2005/0169411 A1* | 8/2005 | Kroeger ............ 375/350 |
| 2006/0159070 A1 | 7/2006 | Deng |
| 2007/0054621 A1 | 3/2007 | Larsson |
| 2007/0076783 A1* | 4/2007 | Dishman et al. ............ 375/136 |
| 2007/0116046 A1 | 5/2007 | Liu |
| 2007/0149135 A1 | 6/2007 | Larsson et al. |
| 2007/0160012 A1 | 7/2007 | Liu |
| 2007/0171866 A1 | 7/2007 | Merz et al. |
| 2008/0018502 A1 | 1/2008 | Wegener |
| 2009/0020632 A1 | 1/2009 | Wegener |
| 2009/0092117 A1 | 4/2009 | Jiang |
| 2009/0149221 A1 | 6/2009 | Liu et al. |
| 2009/0180407 A1 | 7/2009 | Sabat et al. |
| 2009/0265744 A1 | 10/2009 | Singh et al. |
| 2009/0290632 A1* | 11/2009 | Wegener ............ 375/240 |
| 2010/0067366 A1* | 3/2010 | Nicoli ............ 370/210 |
| 2010/0177690 A1 | 7/2010 | Okeeffe et al. |
| 2010/0202311 A1 | 8/2010 | Lunttila et al. |
| 2010/0246642 A1* | 9/2010 | Walton et al. ............ 375/146 |
| 2010/0285756 A1 | 11/2010 | Nakazawa |
| 2011/0280209 A1 | 11/2011 | Wegener |
| 2012/0008696 A1 | 1/2012 | Wegener |
| 2012/0014421 A1 | 1/2012 | Wegener |
| 2012/0014422 A1 | 1/2012 | Wegener |
| 2012/0057572 A1 | 3/2012 | Evans |
| 2012/0176966 A1* | 7/2012 | Ling ............ 370/328 |
| 2012/0183023 A1 | 7/2012 | Filipovic et al. |
| 2012/0202507 A1 | 8/2012 | Zhang et al. |
| 2012/0328121 A1* | 12/2012 | Truman et al. ............ 381/94.3 |

FOREIGN PATENT DOCUMENTS

| | | |
|---|---|---|
| WO | 2005062494 | 7/2005 |
| WO | 2008152455 | 12/2008 |
| WO | 2009/0290632 | 11/2009 |
| WO | 2009143176 | 11/2009 |
| WO | 2009151893 | 12/2009 |
| WO | 2011/0135013 | 6/2011 |

OTHER PUBLICATIONS

International Preliminary Report on Patentability, issued on Nov. 23, 2010, for application PCT/US2009044551.

CPRI Specification V3.0 Common Public Radio Interface (CPRI); Interface Specification, 2, Oct. 2006, 89 pages, Ericsson Ab, huawei Technologies Col Ltd, NEC Corporation, Nortel Networks SA and Siemens networks BmbH & Co. KG.

OBSAI Open Base Station Architecture Initiative Reference Point 3 Specification Ver. 4.0, Mar. 7, 2007, 119 pages.

OBSAI Open base Station Architecture Initiative BTS System Reference document Ver. 2.0, Apr. 27, 2006, 151 pages.

Maruyama, S. et al., "Base Transceiver Station for W-CDMA System," Fujitsu Sci. Tech. J. 38,2, p. 167-73, Dec. 2002.

Supplementary European Search Report, Mailed on Aug. 25, 2014, for application EP11822735.4.

International Search Report, issued on May 30, 2012, for application PCT/US2012/020359.

K. I. Pendersen et al. "Frequency domain scheduling for OFMA with limited and noisy channel feedback" 2007 IEEE 66th Vehicular Technology Conference. pp. 1792-1796, Oct. 3, 2007., see section II. C.

* cited by examiner

| | GSM/EDGE | WCDMA | CDMA | WiMAX |
|---|---|---|---|---|
| Frequency Bands (MHz) | 800, 900, 1800, 1900 | 1800, 1900, 2100 | 800, 1900, 2100 | 2.5, 3.5, 5.8 (GHz) |
| Number of carriers/sector | 1....16 | 1...4 | 1...15 | 1...15 |
| Number of Sectors | 1-6 | 1-6 | 1-6 | 1-6 |
| Baseband Modules | 1-12 | 1-6 | 1-12 | 1-12 |
| RF Modules | 1-9 | 1-9 | 1-9 | 1-9 |
| Antennas/Sector | | | | |
| Regular | 2-4 | 2-4 | 2-4 | 2-4 |
| Smart Antenna | 4-8 | 4-8 | 4-8 | 4-8 |

Figure 2c
Prior Art

OFDM SIGNAL PROCESSING IN A BASE TRANSCEIVER SYSTEM

CROSS-REFERENCE TO RELATED APPLICATIONS

This application is a continuation in part of, and claims priority to, currently pending U.S. Non-Provisional patent application Ser. No. 13/343,636, filed on Jan. 4, 2012 and entitled, "Frequency Domain Compression in a Base Transceiver System", which claims priority to U.S. Provisional Patent Application No. 61/430,901, filed on Jan. 7, 2011 and entitled, "Frequency Domain Compression in a Base Transceiver System".

BACKGROUND OF THE INVENTION

The technology described herein relates to compression and decompression of communication signals in a transceiver system of a wireless communication network and, particularly, to compressing signal samples in the frequency domain prior to transfer over a serial data link between devices in a base transceiver system or a distributed antenna system.

Transceiver systems in wireless communication networks perform the control functions for directing signals among communicating subscribers, or terminals, as well as communication with external networks. The general operations of a radio transceiver system include receiving radio frequency (RF) signals, converting them to signal data, performing various control and signal processing operations on the signal data, converting the signal data to an RF signal and transmitting the RF signal to the wireless subscriber. Transceiver systems in wireless communications networks include radio base stations and distributed antenna systems (DAS). For the reverse link, or uplink, a terminal transmits the RF signal received by the transceiver system. For the forward link, or downlink, the transceiver system transmits the RF signal to a subscriber, or terminal, in the wireless network. A terminal may be fixed or mobile wireless user equipment unit (UE) and may be a wireless device, cellular phone, personal digital assistant (PDA), personal computer or other device equipped with a wireless modem.

Transceiver systems in wireless communication networks must manage the increasing amounts of data required for offering new services to an expanding subscriber base. System design challenges include ensuring flexibility for evolving standards, supporting growing data processing requirements and reducing overall cost. The modular design approach for radio base stations and distributed antenna systems provides the flexibility to meet these challenges. The components of modular designs include base station processors, or radio equipment controllers (RECs) and radio frequency (RF) units, or radio equipment (RE), coupled by serial data links, using copper wire or fiber optic cabling. The REs include transmitters, receivers, analog to digital converters (ADCs) and digital to analog converter (DACs). Wire or fiber optic serial data links transfer the sampled signals between the REs and the REC of the radio base station system. The sampled signals may be centered at the RF or converted to an intermediate frequency (IF) or baseband prior to transfer over the data link. The REC includes functions for signal processing, control and communication with external networks.

In a typical wireless communication network, wireless user equipment units (UEs) communicate via a radio access network (RAN) to one or more core networks. The RAN covers a geographical area which is divided into cell areas, with each cell area being served by a radio base station. A cell is a geographical area where radio coverage is provided by the radio equipment (RE) at a base station site. Each cell is identified by a unique identity, which is broadcast in the cell. The RE communicates over the air interface with the UEs within range of the base station. In the radio access network, several base stations are typically connected (e.g., by landlines or microwave) to a control node known as a base station controller (BSC) or radio network controller (RNC). The control node supervises and coordinates various activities of the plural radio base stations connected to it. The RNCs are typically connected to one or more core networks. One example of a radio access network is the Universal Mobile Telecommunications (UMTS) Terrestrial Radio Access Network (UTRAN). The UTRAN radio access network uses wideband code division multiple access (WCDMA) for communication with the UEs.

The modular design approach for radio transceiver systems has led the industry to develop interface standards. One example of an internal interface of a transceiver system which links the radio equipment to a radio equipment control controller is the Common Public Radio Interface (CPRI). The Common Public Radio Interface Specification Version 4.1 (2009 Feb. 18) and previous versions, referred to herein as "CPRI specification," define a publicly available specification for the data transfer interfaces between the radio equipment (RE) and radio equipment controllers (REC) of transceiver systems, including base stations and distributed antenna systems (DAS). The radio equipment control (REC) processes baseband signal data and communicates with the RNC via an interface referred to as "Iub" for UMTS. The radio equipment (RE) performs the RF processing for transmission of signals over the antenna to UEs, referred to as "Uu" for the UMTS air interface. The REC and RE correspond to the base station processor and the RF unit, respectively. The CPRI specification defines protocols for the serial interface and operations at the physical layer (Layer 1) and the data link layer (Layer 2). Layer 1 and Layer 2 are two of seven categories in the hierarchy of communications functions defined for the "Open System Interconnection (OSI)" network architecture developed by the International Organization for Standardization (ISO), referred to as the ISO-OSI network architecture. The serial data link between REC and RE or between two REs, is a bidirectional interface with one transmission line per direction. Connection topologies between the REC and one or more REs include point-to-point, multiple point-to-point, chain, star, tree, ring and combinations thereof.

The CPRI specification supports cellular radio standards 3GPP UTRA FDD, Release 8 (December 2008) and 3GPP E-UTRA, Release 8 (December 2008). The CPRI specification also supports the wireless networking protocol Worldwide Interoperability for Microwave Access, known as WiMax (IEEE 802.16-2004 and IEEE 802.16e-2005). For WiMax, the REC provides access to network entities, such as other WiMax base stations or a WiMax Access Service Network Gateway (ASN-GW). The RE provides the air interface to the subscriber station or mobile subscriber station.

Another example of an interface specification for modular architecture of radio transceiver systems is the Open Base Station Architecture Initiative (OBSAI). The OBSAI specification describes alternative protocols for the interconnection of RF modules, analogous to RE of the CPRI specification, and baseband modules, analogous to REC of the CPRI specification, as well as data transfer protocols for the serial data links The OBSAI standard supports several wireless modulation formats, including GSM/EDGE, WCDMA, CDMA and WiMax. The OBSAI standard can also accommodate other wireless network configurations or signal modulation formats by incorporating general purpose modules. The OBSAI standard is described in the documents, "OBSAI Open Base Station Architecture Initiative BTS System Reference Document," Version 2.0, 2006, and "OBSAI Open Base Station Architecture Initiative Reference Point 3 Specification," Version 4.0, 2007.

The OBSAI standard describes architectures and protocols for communication between base station processors, referred to as baseband modules, and RF modules. Connection topologies for one or more baseband modules and one or more RF modules include mesh, centralized combiner/distributor and bridge modules. The OBSAI compliant serial data link connecting the baseband module and the RF module is referred to as the reference point 3 (RP3) interface. In systems where remote RF units (RRUs) are connected to a baseband module, the serial data link is referred to as the RP3-01 interface. Connection topologies for the baseband module and RRUs include point-to-point, chain, ring and tree-and-branch. The baseband module/RRUs configurations support distributed antenna systems.

Both the CPRI and the OBSAI architectures apply time-division multiplexing to baseband signal data for transmission over a serial data link. Proprietary or other modular designs for radio base transceiver systems may not comply with CPRI or OBSAI standards.

A distributed antenna system (DAS) distributes signal data from a main antenna or radio data resource to multiple remote antennas connected via Cat5 cable, coaxial cable or fiber optic links. A DAS can connect to a variety of wireless services and then rebroadcast those signals throughout the areas in which the DAS is installed. For example, a DAS can improve cellular telephone coverage within a large building or other structure. A main transceiver and antenna positioned on the roof of the building is connected by cable or fiber to multiple distributed antennas within the building. A DAS may include a "head end" into which source signals are combined for distribution to remote radio units. A DAS system may provide coverage in confined spaces, such as high rise buildings, tunnels, railways and airports. As defined by the DAS Forum of the Personal Communications Industry Association (PCIA), a DAS is a network of spatially separated antenna nodes connected to a common source via a transport medium that provides wireless communication service within a geographic area or structure. The DAS antenna elevations are generally at or below the clutter level and node installations are compact. A digital serial data link may connect the head end to the remote radio units, or heads.

For this description, "base transceiver system" (BTS) refers to the base station processor(s) and the RF units(s) in communication with and under the control of the base station processor, including any type or length of data transfer link. This includes the conventional base station having RF units collocated with the base station processor or on an antenna tower near the antenna. A DAS is another example of a BTS, although the RF units may be located remotely from the base station processor.

Base transceiver systems for wireless communication networks transfer large amounts of sampled signal data over the serial data links between the base station processor and the RF modules. The need to comply with evolving wireless communication standards, increase data volume and serve more subscribers, may require expensive hardware upgrades to transceiver systems, including increasing the number or capacity of serial data links and increasing the data processing capability of supporting subsystems. These requirements can conflict with constraints on transceiver systems, including physical size limitations, power consumption limitations and geographic restrictions.

Therefore, there is a need for increasing the capacity of serial data links and conserving the resources of base transceiver systems for base stations and distributed antenna systems. Compression of data prior to transfer over the serial data links enables the provider to meet these needs by increasing the capacity of existing data links, possibly eliminating or at least postponing, the need to upgrade the existing data links. Increasing the capacity of the data links lowers the cost of data transfer in base transceiver systems. There is also a need for providing compressed signal samples and formatting the compressed samples for compatibility with the data transfer protocols of the BTS, such as CPRI, OBSAI or other data transfer protocols.

SUMMARY OF THE INVENTION

Embodiments of the present invention have been made in consideration of the foregoing conventional problems.

A base station transceiver system described herein for a wireless communication network includes a plurality of radio frequency (RF) units coupled to a baseband processor, and implements frequency domain compression over data links between the RF units and the baseband processor. In embodiments described herein, RF units include circuitry to transform time domain signal samples in baseband channels to the frequency domain, and to compress the frequency domain signal samples by applying attenuation profiles in the frequency domain. The RF units include communication interfaces to transmit the compressed frequency domain samples across the corresponding data links to the baseband processor, where they are decompressed using complementary circuitry, and can be transformed back to the time domain for processing by logic in the baseband processor. Likewise, the RF units include circuitry to receive compressed frequency domain samples from the baseband processor, decompress the samples using gain profiles complementary to the attenuation profiles used for compression, and transform the decompressed frequency domain samples to the time domain for transmission on the wireless network. The attenuation profiles can be matched to the frequency domain characteristics of the signal samples in the baseband channels, the characteristics including modulation formats.

As a result of the techniques described herein, significant compression is achieved with relatively low processing overhead, along with significant improvements in overall communications throughput for the base station transceiver system.

One aspect of the technology described herein provides, in a base transceiver system of a wireless communication network, a method for transferring signal data from a radio frequency (RF) unit to a baseband processor over a serial data link, wherein the RF unit is connected to an antenna to receive an analog signal, the analog signal representing a plurality of antenna-carrier channels, the RF unit including an analog to digital converter (ADC) that converts the analog signal to a digital signal and a digital down converter (DDC) that down-converts the digital signal to a plurality of baseband channels, each baseband channel corresponding to one of the antenna-carrier channels and having a sequence of signal samples, wherein each signal sample includes an in-phase (I) sample and a quadrature (Q) sample, wherein the baseband processor performs signal processing operations on the signal samples received from the RF unit. A method in accordance with the present invention includes, compressing the signal samples of each baseband channel at the RF unit, the compressing comprising for each baseband channel, computing a frequency domain transform of a plurality of the signal samples of each baseband channel at the RF unit to form a plurality of frequency domain coefficients, wherein the frequency domain coefficients include a real component and an imaginary component for each of a plurality of frequency bins, attenuating one or more of the frequency domain coefficients in accordance with an attenuation profile to form a plurality of attenuated coefficients, wherein the attenuation profile specifies attenuation levels corresponding to the frequency bins, encoding the attenuated coefficients to form compressed coefficients. The method further comprises formatting the compressed coefficients of the plurality of baseband channels for transfer over the serial data link, transferring the compressed coefficients over the serial data link from the RF unit to the baseband processor, receiving the compressed coefficients at the baseband processor, decompressing the compressed coefficients at the baseband processor, the decompressing comprising for each baseband channel, decoding the compressed coefficients to form reconstructed attenuated coefficients, amplifying a plurality of the reconstructed attenuated coefficients in accordance with a gain profile to form a plurality of decompressed coefficients corresponding to each baseband channel, wherein the gain profile corresponds to the attenuation profile and specifies gain levels for corresponding frequency bins and computing an inverse frequency domain transform of the plurality of decompressed coefficients to form a plurality of decompressed signal samples of the corresponding baseband channel, wherein each decompressed signal sample includes a decompressed I sample and a decompressed Q sample, wherein the baseband processor applies the signal processing operations to the decompressed signal samples for each baseband channel.

Another aspect of the technology described herein provides, in a base transceiver system of a wireless communication network, a method for transferring signal samples from a baseband processor to a radio frequency (RF) unit over a serial data link, each signal sample associated with one of a plurality of baseband channels, wherein each signal sample includes an in-phase (I) sample and a quadrature (Q) sample, the RF unit including a digital up converter (DUC) that upconverts a sequence of signal samples of each baseband channel to a corresponding one of a plurality of antenna-carrier channels to form a single upconverted digital signal and a digital to analog converter (DAC) that converts the upconverted digital signal to an analog signal, wherein the RF unit is coupled to an antenna to transmit the analog signal, the analog signal representing the plurality of antenna-carrier channels. The method includes compressing the signal samples of each baseband channel at the baseband processor, the compressing comprising for each baseband channel, computing a frequency domain transform of a plurality of the signal samples of each baseband channel to form a plurality of frequency domain coefficients, wherein the frequency domain coefficients include a real component and an imaginary component for each of a plurality of frequency bins, attenuating one or more of the frequency domain coefficients in accordance with an attenuation profile to form a plurality of attenuated coefficients, wherein the attenuation profile specifies attenuation levels corresponding to the frequency bins, encoding the attenuated coefficients to form compressed coefficients. The method further includes, formatting the compressed coefficients of the plurality of baseband channels for transfer over the serial data link, transferring the compressed coefficients over the serial data link from the baseband processor to the RF unit, receiving the compressed coefficients at the RF unit, decompressing the compressed coefficients at the RF unit, the decompressing comprising for each baseband channel, decoding the compressed coefficients to form reconstructed attenuated coefficients, amplifying a plurality of the reconstructed attenuated coefficients in accordance with a gain profile to form a plurality of decompressed coefficients corresponding to each baseband channel, wherein the gain profile corresponds to the attenuation profile and specifies gain levels for corresponding frequency bins and computing an inverse frequency domain transform of the plurality of decompressed coefficients to form a plurality of decompressed signal samples of the corresponding baseband channel, wherein each decompressed signal sample includes a decompressed I sample and a decompressed Q sample, wherein the decompressed signal samples are provided to the DUC for forming the upconverted digital signal.

Another aspect of the technology described herein provides, in a base transceiver system of a wireless communication network, including a radio frequency (RF) unit coupled to an antenna to receive an analog signal and a baseband processor coupled to the RF unit by a serial data link, the analog signal representing a plurality of antenna-carrier channels, the RF unit including an analog to digital converter (ADC) that converts the analog signal to a digital signal and a digital down converter (DDC) that downconverts the digital signal to a plurality of baseband channels, each baseband channel corresponding to one of the antenna-carrier channels and having a sequence of signal samples, wherein each signal sample includes an in-phase (I) sample and a quadrature (Q) sample, wherein the baseband processor performs signal processing operations on the signal samples received from the RF unit, an apparatus for data transfer from the RF unit to the baseband processor over the serial data link, the apparatus including a plurality of compressors at the RF unit, each compressor coupled to receive the signal samples of a corresponding baseband channel output from the DDC, the compressor further comprising, logic to compute a frequency domain transform of a plurality of the signal samples of the corresponding baseband channel to form a plurality of frequency domain coefficients, wherein the frequency domain coefficients include a real component and an imaginary component for each of a plurality of frequency bins, an attenuator to adjust the frequency domain coefficients in accordance with an attenuation profile to form a plurality of attenuated coefficients, wherein the attenuation profile specifies attenuation levels corresponding to the frequency bins, wherein the attenuation profile is stored in a first memory coupled to the attenuator, an encoder coupled to the attenuator to encode the attenuated coefficients to form compressed coefficients. The apparatus further including a formatter coupled to the plurality of compressors to format the compressed coefficients of the plurality of baseband channels in accordance with a data transfer protocol, the serial data link coupled to the formatter for transferring the compressed coefficients to the baseband processor, the baseband processor coupled to the serial data link to receive the compressed coefficients and a plurality of decompressors at the baseband processor, each decompressor receiving the compressed coefficients of the corresponding baseband channel. The decompressor further comprising a decoder to decode the compressed coefficients to form reconstructed attenuated coefficients, an amplifier coupled to the decoder to increase magnitudes of a plurality of the reconstructed attenuated coefficients in accordance with a gain profile to form a plurality of decompressed coefficients, wherein the gain profile corresponds to the attenuation profile and specifies gain levels corresponding to the frequency bins, wherein the gain profile is stored in a second memory coupled to the amplifier, and logic coupled to the amplifier to compute an inverse frequency domain transform of the plurality of decompressed coefficients to form a plurality of decompressed signal samples of the corresponding baseband channel, wherein each decompressed signal sample includes a decompressed I sample and a decompressed Q sample, wherein the baseband processor applies the signal processing operations to the decompressed signal samples for each baseband channel.

Another aspect of the technology described herein provides, in a base transceiver system of a wireless communication network, including a radio frequency (RF) unit coupled to an antenna to transmit an analog signal and a baseband processor coupled to the RF unit by a serial data link, the baseband processor providing a plurality of signal samples to the RF unit, each signal sample associated with one of a plurality of baseband channels, wherein each signal sample includes an in-phase (I) sample and a quadrature (Q) sample, the RF unit including a digital up converter (DUC) that upconverts a sequence of signal samples of each baseband channel to a corresponding one of a plurality of antenna-carrier channels to form a single upconverted digital signal and a digital to analog converter (DAC) that converts the upconverted digital signal to the analog signal, the analog signal representing the plurality of antenna-carrier channels, an apparatus for data transfer from the baseband processor to the RF unit. The apparatus including a plurality of compressors at the baseband processor, each compressor compressing signal samples of a corresponding baseband channel, the compressor further including, logic to compute a frequency domain transform of a plurality of the signal samples of the corresponding baseband channel to form a plurality of frequency domain coefficients, wherein the frequency domain coefficients include a real component and an imaginary component for each of a plurality of frequency bins, an attenuator to adjust the frequency domain coefficients in accordance with an attenuation profile to form a plurality of attenuated coefficients, wherein the attenuation profile specifies attenuation levels corresponding to the frequency bins, wherein the attenuation profile is stored in a first memory coupled to the attenuator, an encoder coupled to the attenuator to encode the attenuated coefficients to form compressed coefficients. The apparatus further including a formatter coupled to the plurality of compressors to format the compressed coefficients in accordance with a data transfer protocol, the serial data link coupled to the formatter for transferring the compressed coefficients to the RF unit, the RF unit coupled to the serial data link to receive the compressed coefficients and a plurality of decompressors at the RF unit, each decompressor receiving the compressed coefficients of the corresponding baseband channel. The decompressor further including a decoder to decode the compressed coefficients to form reconstructed attenuated coefficients, an amplifier coupled to the decoder to increase magnitudes of a plurality of the reconstructed attenuated coefficients in accordance with a gain profile to form a plurality of decompressed coefficients, wherein the gain profile corresponds to the attenuation profile and specifies gain levels corresponding to the frequency bins, wherein the gain profile is stored in a second memory coupled to the amplifier and logic coupled to the amplifier to compute an inverse frequency domain transform of the plurality of decompressed coefficients to form a plurality of decompressed signal samples of the corresponding baseband channel, wherein each decompressed signal sample includes a decompressed I sample and a decompressed Q sample, wherein the decompressed signal samples are provided to the DUC for forming the upconverted digital signal.

Another aspect of the technology described herein provides, an integrated circuit device for compressing signal data for transmission over a serial data link in a base transceiver system of a wireless communication network. The integrated circuit device comprising a plurality of compressors, each of the plurality of compressors to receive a plurality of signal samples representative of the signal data of a corresponding baseband channel. Each of the plurality of compressors comprising, a frequency transform unit to compute a frequency domain transform of the plurality of signal samples to generate a plurality of frequency domain coefficients for each of a plurality of frequency bins, an attenuator coupled to the frequency transform unit, the attenuator to adjust the plurality of frequency domain coefficients in accordance with an attenuation profile to generate a plurality of attenuated coefficients, wherein the attenuation profile specifies attenuation levels corresponding to the plurality of frequency bins and an encoder coupled to the attenuator, the encoder to encode the attenuated coefficients to form a plurality of compressed coefficients for transmission over the serial data link.

Another aspect of the technology described herein provides, an integrated circuit device for decompressing a plurality of compressed coefficients received over a serial data link in a base transceiver system of a wireless communication network. The integrated circuit device comprising, a plurality of decompressors, each of the plurality of decompressors to receive a plurality of compressed coefficients of a corresponding baseband channel. Each of the plurality of decompressors comprising, a decoder to decode the plurality of compressed coefficients to form a plurality of reconstructed attenuated coefficients, an amplifier coupled to the decoder, the amplifier to increase a magnitude of at least one of the plurality of reconstructed attenuated coefficients in accordance with a gain profile to form a plurality of decompressed coefficients, wherein the gain profile corresponds to an attenuation profile associated with the plurality of compressed coefficients and the gain profile specifies gain levels corresponding to a plurality of frequency bins of the compressed coefficients, an inverse frequency domain transform unit coupled to the amplifier, the inverse frequency domain transform unit to compute an inverse frequency transform of the plurality of decompressed coefficients to generate a plurality of decompressed signal samples of the corresponding baseband channel.

Additional advantages may be realized through a modification to the architecture of the base transceiver system employed in an OFDM wireless communication network. In these embodiments of the present invention, the logic for performing the OFDM frequency domain transform and the OFDM inverse frequency domain transform are relocated from the baseband unit to the RF unit of the base transceiver.

In one aspect of the modified architecture described herein, a base transceiver system of an OFDM wireless communication network may include a radio frequency (RF) unit coupled to an antenna to receive an analog signal and a baseband unit coupled to the RF unit by a serial data link, the analog signal representing a plurality of antenna-carrier channels, the RF unit including an analog to digital converter (ADC) that converts the analog signal to a digital signal and a digital down converter (DDC) that downconverts the digital signal to a plurality of baseband channels, each baseband channel corresponding to one of the antenna-carrier channels and having a sequence of signal samples, wherein each signal sample includes an in-phase (I) sample and a quadrature (Q) sample, wherein a baseband processor of the baseband unit performs signal processing operations on the signal samples received from the RF unit and an apparatus for data transfer from the RF unit to the baseband unit over the serial data link. The apparatus for data transfer from the RF unit to the baseband unit over the serial data link may include, a plurality of compressors at the RF unit, each compressor coupled to receive the signal samples of a corresponding baseband channel output from the DDC. Each of the plurality of compressors may include, logic to compute an OFDM frequency domain transform of a plurality of the signal samples of the corresponding baseband channel to form a plurality of frequency domain coefficients, wherein the frequency domain coefficients include a real component and an imaginary component for each of a plurality of frequency bins, wherein a length of the OFDM frequency domain transform is equal to a symbol length of the OFDM signal data. The apparatus for data transfer may further include, an attenuator to adjust the frequency domain coefficients in accordance with an attenuation profile to form a plurality of attenuated coefficients, wherein the attenuation profile specifies attenuation levels corresponding to the frequency bins, wherein the attenuation profile is stored in a first memory coupled to the attenuator; an encoder coupled to the attenuator to encode the attenuated coefficients to form compressed coefficients, a formatter coupled to the plurality of compressors to format the compressed coefficients of the plurality of baseband channels in accordance with a data transfer protocol. A baseband unit may be coupled to the serial data link to receive the compressed coefficients. The baseband unit may include a plurality of decompressors at the baseband unit, each decompressor receiving the compressed coefficients of the corresponding baseband channel. Each of the plurality of decompressors may include a decoder to decode the compressed coefficients to form reconstructed attenuated coefficients, an amplifier coupled to the decoder to increase magnitudes of a plurality of the reconstructed attenuated coefficients in accordance with a gain profile to form a plurality of decompressed coefficients, wherein the gain profile corresponds to the attenuation profile and specifies gain levels corresponding to the frequency bins, wherein the gain profile is stored in a second memory coupled to the amplifier and a baseband processor of the baseband unit to apply the signal processing operations to the decompressed signal samples for each baseband channel.

In an additional aspect, the plurality of compressors may further comprise logic coupled to the output of the DDC to remove the OFDM cyclic prefix from the plurality of signal samples prior to performing the OFDM transform of the signal samples.

As such, in the modified architecture of the present invention, the logic for computing the OFDM frequency domain transform is relocated from the baseband unit to the RF unit. Relocating the OFDM frequency domain transform simplifies the design of the baseband unit by removing unnecessary processing steps and increases the compression rate by removing the cyclic prefix from the signal data prior to transmitting the data over the serial data link in an uplink mode.

In another aspect employing the modified architecture, a base transceiver system of an OFDM wireless communication network may include, a radio frequency (RF) unit coupled to an antenna to transmit an analog signal and a baseband unit coupled to the RF unit by a serial data link, the baseband unit providing a plurality of signal samples to the RF unit, each signal sample associated with one of a plurality of baseband channels, wherein each signal sample includes an in-phase (I) sample and a quadrature (Q) sample, the RF unit including a digital up converter (DUC) that upconverts a sequence of signal samples of each baseband channel to a corresponding one of a plurality of antenna-carrier channels to form a single upconverted digital signal and a digital to analog converter (DAC) that converts the upconverted digital signal to the analog signal, the analog signal representing the plurality of antenna-carrier channels, an apparatus for data transfer from the baseband unit to the RF unit. The apparatus for the data transfer from the baseband unit to the RF unit may include, a plurality of compressors at the baseband unit, each compressor for receiving frequency domain coefficients for a plurality of baseband channels of the OFDM modulated signal data, wherein the frequency domain coefficients include a real component and an imaginary component for each of a plurality of frequency bins and for compressing frequency domain coefficients of a corresponding baseband channel. Each of the plurality of compressors may include, an attenuator to adjust the frequency domain coefficients in accordance with an attenuation profile to form a plurality of attenuated coefficients, wherein the attenuation profile specifies attenuation levels corresponding to the frequency bins, wherein the attenuation profile is stored in a first memory coupled to the attenuator, an encoder coupled to the attenuator to encode the attenuated coefficients to form compressed coefficients and a formatter coupled to the plurality of compressors to format the compressed coefficients in accordance with a data transfer protocol. The RF unit coupled to the serial data link to receive the compressed coefficients may include a plurality of decompressors at the RF unit. Each of the plurality of decompressors may include a decoder to decode the compressed coefficients to form reconstructed attenuated coefficients an amplifier coupled to the decoder to increase magnitudes of a plurality of the reconstructed attenuated coefficients in accordance with a gain profile to form a plurality of decompressed coefficients, wherein the gain profile corresponds to the attenuation profile and specifies gain levels corresponding to the frequency bins, wherein the gain profile is stored in a second memory coupled to the amplifier and logic coupled to the amplifier to compute an OFDM inverse frequency domain transform of the plurality of decompressed coefficients to form a plurality of decompressed signal samples of the corresponding baseband channel, wherein each decompressed signal sample includes a decompressed I sample and a decompressed Q sample, wherein a length of the OFDM frequency domain transform is equal to a symbol length of the OFDM signal data and wherein the decompressed signal samples are provided to the DUC for forming the upconverted digital signal.

In an additional aspect, the plurality of decompressors may further comprise logic coupled to the OFDM inverse frequency domain transform to insert an OFDM cyclic prefix into the plurality of signal samples.

As such, in the modified architecture of the present invention, the logic for computing the OFDM frequency domain transform is relocated from the baseband unit to the RF unit. Relocating the OFDM frequency domain transform simplifies the design of the baseband unit by removing unnecessary processing steps and increases the compression rate by delaying the insertion of the cyclic prefix into the signal samples until after the signal data has been transmitted over the serial data link when operating in a downlink mode.

In operation of the modified architecture in an uplink mode, a method for transferring OFDM modulated signal data from a radio frequency (RF) unit to a baseband unit over a serial data link may include, compressing the plurality of signal samples of each baseband channel at the RF unit, wherein for each baseband channel the compressing may include, computing an OFDM frequency domain transform of a plurality of the signal samples of each baseband channel at the RF unit to form a plurality of frequency domain coefficients, wherein the frequency domain coefficients include a real component and an imaginary component for each of a plurality of frequency bins and wherein a length of the OFDM frequency domain transform is equal to a symbol length of the OFDM modulated signal data, attenuating one or more of the frequency domain coefficients in accordance with an attenuation profile to form a plurality of attenuated coefficients, wherein the attenuation profile specifies attenuation levels corresponding to the frequency bins, encoding the attenuated coefficients to form compressed coefficients and formatting the compressed coefficients of the plurality of baseband channels for transfer over the serial data link. After the transfer the compressed coefficients over the serial data link, the method may further include decompressing the compressed coefficients at the baseband unit, wherein for each baseband channel the decompressing comprises, decoding the compressed coefficients to form reconstructed attenuated coefficients, amplifying a plurality of the reconstructed attenuated coefficients in accordance with a gain profile to form a plurality of decompressed coefficients corresponding to each baseband channel, wherein the gain profile corresponds to the attenuation profile and specifies gain levels for corresponding frequency bins and providing the decompressed coefficients to the baseband processor of the baseband unit to apply the signal processing operations to the decompressed coefficients.

As such, in operation of the modified architecture in an uplink mode, OFDM demodulation is relocated from the baseband unit to the RF unit, thereby removing unnecessary processing steps and simplifying the design of the baseband unit. In addition, removal of the OFDM cyclic prefix may also be performed prior to the transfer of the signal data over the data link, thereby providing greater compression of the signal data prior to transmission over the data link.

In operation of the modified architecture in a downlink mode, a method for transferring OFDM modulated signal data from a baseband unit to a radio frequency (RF) unit over a serial data link may include, receiving a plurality of frequency domain coefficients for a plurality of baseband channels of the OFDM modulated signal data at the baseband unit, wherein the frequency domain coefficients include a real component and an imaginary component for each of a plurality of frequency bins, compressing the frequency domain coefficients of each baseband channel at the baseband unit, wherein for each baseband channel the compressing comprises, attenuating one or more of the frequency domain coefficients in accordance with an attenuation profile to form a plurality of attenuated coefficients, wherein the attenuation profile specifies attenuation levels corresponding to the frequency bins, encoding the attenuated coefficients to form compressed coefficients and formatting the compressed coefficients of the plurality of baseband channels for transfer over the serial data link. After transfer of the compressed coefficients over the serial data link, the method may further include, receiving the compressed coefficients at the RF unit and decompressing the compressed coefficients at the RF unit, wherein for each baseband channel the decompressing comprises, decoding the compressed coefficients to form reconstructed attenuated coefficients, amplifying a plurality of the reconstructed attenuated coefficients in accordance with a gain profile to form a plurality of decompressed coefficients corresponding to each baseband channel, wherein the gain profile corresponds to the attenuation profile and specifies gain levels for corresponding frequency bins, computing an OFDM inverse frequency domain transform of the plurality of decompressed coefficients to form a plurality of decompressed signal samples of the corresponding baseband channel, wherein each decompressed signal sample includes a decompressed I sample and a decompressed Q sample, wherein a length of the OFDM inverse frequency domain transform is equal to a symbol length of the OFDM signal data and providing the decompressed signal samples to the DUC for forming the upconverted digital signal.

As such, in operation of the modified architecture in a downlink mode, OFDM demodulation is relocated from the baseband unit to the RF unit, thereby removing unnecessary processing steps and simplifying the design of the baseband unit. In addition, insertion of the OFDM cyclic prefix may also be delayed until after the transfer of the signal data over the data link, thereby providing greater compression of the signal data prior to transmission over the data link.

BRIEF DESCRIPTION OF THE DRAWINGS

FIG. 2c is a table of the wireless modulation formats supported by the OBSAI standard, in accordance with the prior art.

DETAILED DESCRIPTION

The following describes frequency domain compression and decompression of signal samples for transfer in base transceiver systems. Example architectures of base transceiver systems include a general base station, OBSAI or CPRI base stations and distributed antenna systems. The preferred methods for compression and decompression applied to the signal samples processed by the transceiver systems are then described.

Figure 1A:
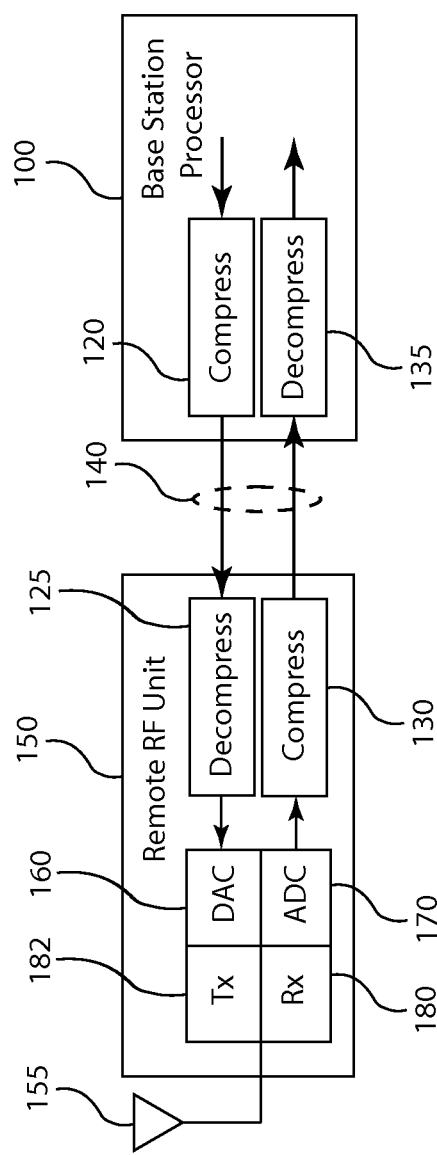
FIG. 1a is a block diagram of a general base station architecture that incorporates compression and decompression.

FIG. 1a is a block diagram of a general base station architecture that incorporates frequency domain compression and decompression in accordance with the technology described herein. The BTS architecture includes the base station processor 100 connected by one or more serial data links 140 to an RF unit 150. This general architecture can be used for any air interface standard employed by a wireless communication network, including GSM/EDGE, code division multiple access (CDMA) based modulation formats, orthogonal frequency division multiplexing (OFDM) based modulation formats such as WiMax and other signal modulation formats that may evolve. The remote RF unit 150 can be located near the antenna 155 on an antenna tower. The RF unit 150 can be connected to multiple antennas for transmission, reception, diversity or beamforming. The serial data link 140 can be implemented by fiber optic, coaxial cable or RJ-45 twisted pair. The base station processor 100 performs signal processing functions to prepare data for transmission by the RF unit 150 or to recover data from signal samples received from the RF unit 150. The types of functions performed by the base station processor include symbol modulation/demodulation, channel encoding/decoding, spreading/despreading for CDMA, forward/inverse fast Fourier transformation for OFDM, diversity processing for transmission/reception, interference cancellation, equalization, time and frequency synchronization, upconverting/downconverting, multiplexing/demultiplexing and data transport to/from an external network (not shown).

For the transmit path, or downlink, the base station processor 100 performs the signal processing functions to modulate communication data that were extracted from previously received wireless signals or signals received from an external network to produce digital signals. The signal processing functions depend on the modulation format and can include symbol modulation, channel coding, spreading for CDMA, diversity processing for transmission, time and frequency synchronization, upconverting, multiplexing, and inverse fast Fourier transformation for OFDM. The digital signals may have a center frequency of 0 Hz, an intermediate frequency (IF) or a radio frequency (RF), depending on the system design. The compressor 120 applies frequency domain compression to the samples of the digital signal to form compressed coefficients for transfer over a serial data link 140 to the RF unit 150. At the RF unit 150, the decompressor 125 applies frequency domain decompression to the compressed coefficients to reconstruct the digital signal before digital to analog conversion. The digital to analog converter (DAC) 160 converts the reconstructed digital signal to an analog signal. The transmitter 182 prepares the analog signal for transmission by the antenna 155, including up-conversion to the appropriate radio frequency, RF filtering and amplification.

For the receive path, or uplink, antenna 155 at the RF unit 150 receives an RF analog signal representing modulated communication data from one or more wireless sources, or subscribers. The frequency band of the received signal can be a composite of transmitted signals from multiple wireless subscribers. Depending on the air interface protocol, the different subscriber signals can be assigned to certain frequency channels or multiple subscribers can be assigned to a particular frequency band. In the case of CDMA air interface protocols, the multiple subscriber signals are assigned to a particular frequency band and each subscriber signal is spread across the band using a unique spreading code. The receiver 180 performs analog operations on the RF analog signal, including RF filtering, amplification and down-conversion to shift the center frequency of the received signal from RF to an IF or 0 Hz, depending on system design. The analog to digital converter (ADC) 170 converts the received analog signal to a digital signal to produce signal samples that have only real values or, alternatively, have in phase (I) and quadrature (Q) components, based on system design. The compressor 130 applies frequency domain compression to the digital signal samples before transmission over the serial data link 140. At the base station processor 100, the decompressor 135 applies frequency domain decompression to the compressed coefficients to reconstruct the digital signal prior to performing the normal signal processing to recover communication data from the decompressed digital signal. The processing operations can include demodulating symbols, channel decoding, despreading (for CDMA modulation formats), diversity processing, interference cancelling, equalizing, time and frequency synchronization, downconverting, demultiplexing, fast Fourier transformation (for OFDM modulation formats) and transporting data derived from the decompressed signal samples to an external network.

Figure 1B:
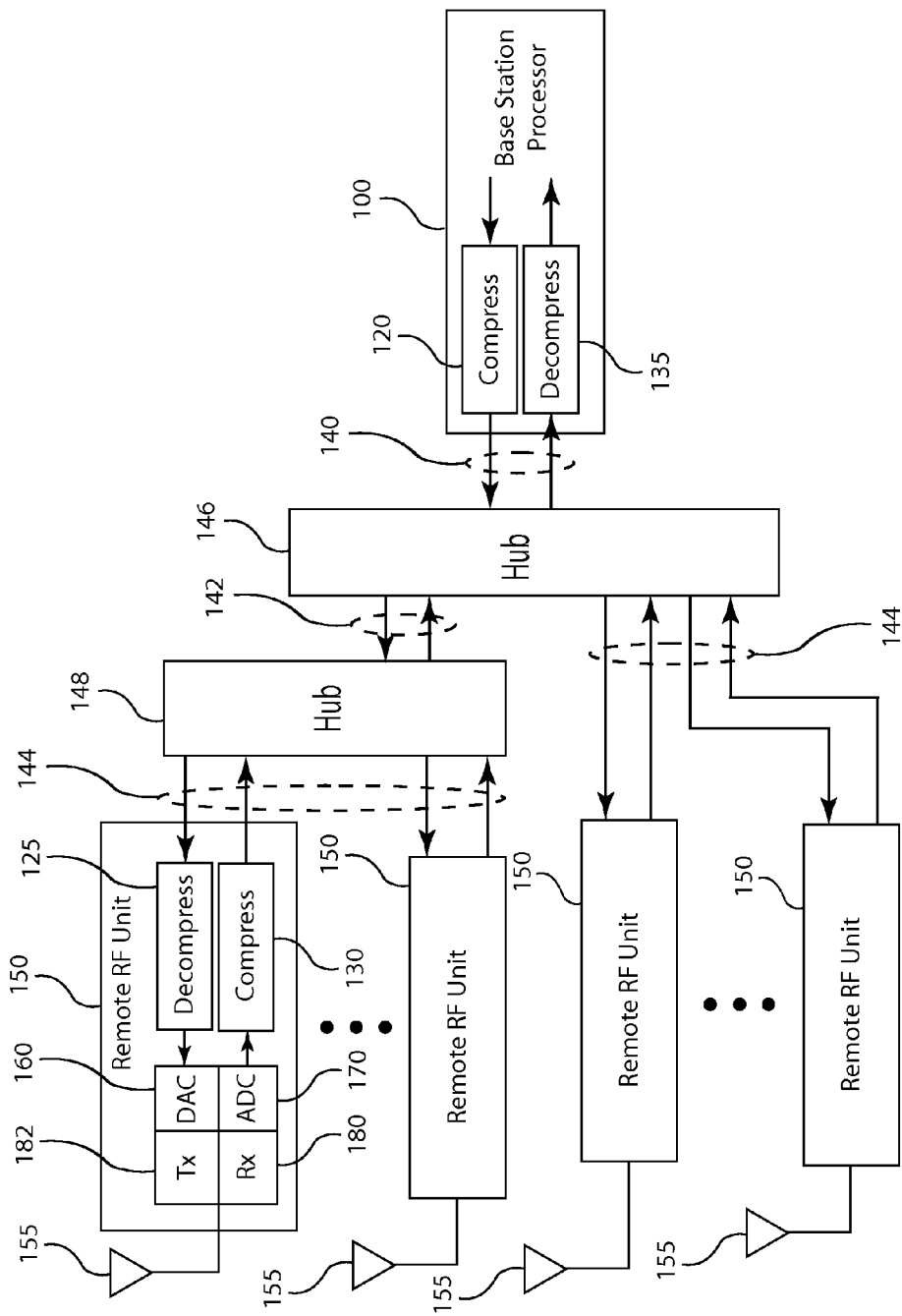
FIG. 1b is a block diagram of an example of a distributed antenna system (DAS) including compression and decompression.

The base station processor 100 and RF unit 150 may be referred to by other names in the art. A base station processor 100 can process signal samples having any center frequency, i.e. RF, IF or zero, depending on the system design. For a base transceiver system where the signal samples have a center frequency of approximately zero, or baseband signal samples, the base station processor 100 may be referred to as a baseband processor, baseband module, radio equipment controller or other terminology. FIG. 1b is a block diagram of an example of a distributed antenna system (DAS). The base station processor 100 is connected to a plurality of remote RF units 150 and their associated antennas 155. The DAS can have a plurality of remote RF units 150 that typically are located tens to hundreds of meters from the base station processor 100. The base station processor 100 is part of a main transceiver system, such as the BTS shown in FIG. 1a, that typically has collocated RF. The main transceiver may be located on the roof of a building, for example. Each remote RF unit 150 includes a compressor 130, decompressor 125, ADC 170, DAC 160, transmitter 182 and receiver 180, although these components are represented in only one remote RF unit 150 for simplicity. In this example, the base station processor 100 is connected to the remote RF units 150 via a hub 146. The hub 146 is then connected via data link 142 to another hub 148 or via links 144 to a plurality of remote RF units 150. These data links 140, 142 and 144 may have identical characteristics or may be different depending on the system design. For the transmit path, the compressor 120 at the base station processor 100 applies frequency domain compression to the signal samples. The compressed coefficients are transferred via data link 140 to the hub 146, via data link 142 to another hub 148 and via data links 144 to a plurality of remote RF units 150. Compressed data can remain compressed when passing through the hubs 146 and 148. At each remote RF unit 150, the decompressor 125 applies frequency domain decompression to the received compressed coefficients before digital to analog conversion 160. The transmitter 182 processes the resulting analog signal for transmission via antenna 155. For the receive path at each remote RF unit 150, each antenna 155 provides an analog signal to the receiver 180. The ADC 170 converts the received analog signal to a digital signal. The compressor 130 applies frequency domain compression to the digital signal before transfer via the appropriate data link 140, 142 or 144 and hubs 148 and 146 to the base station processor 100. The decompressor 135 applies frequency domain decompression to the compressed coefficients to reconstruct the digital signal before conventional signal processing by the base station processor 100. Distributed antenna systems may transfer IF or RF digital signals over the data links 140, 142 and 144, as described with respect to FIG. 1a, or may transfer digital baseband signals as further described in the following.

The compressor 120/130 packs the compressed coefficients in compressed data packets having a format compatible with the data transfer protocol of the serial data link. The compressor 120/130 adds a header portion to some or all of compressed data packets. Alternatively, the header can be encoded in overhead bits, if available for the data transfer protocol. The header portion has a defined length and includes synchronization and control information for the decompressor 125/135. The compressor 120/130 may pack the compressed coefficients in any order; however the decompressor 125/135 will reorder and format the decompressed samples to comply with the data representation format expected by the BTS. The serial data link may have a proprietary data transfer protocol or a standard protocol. The decompressor 125/135 extracts the synchronization and control information from the header for decompressing and reconstructing the sequence of signal samples.

Figure 2A:
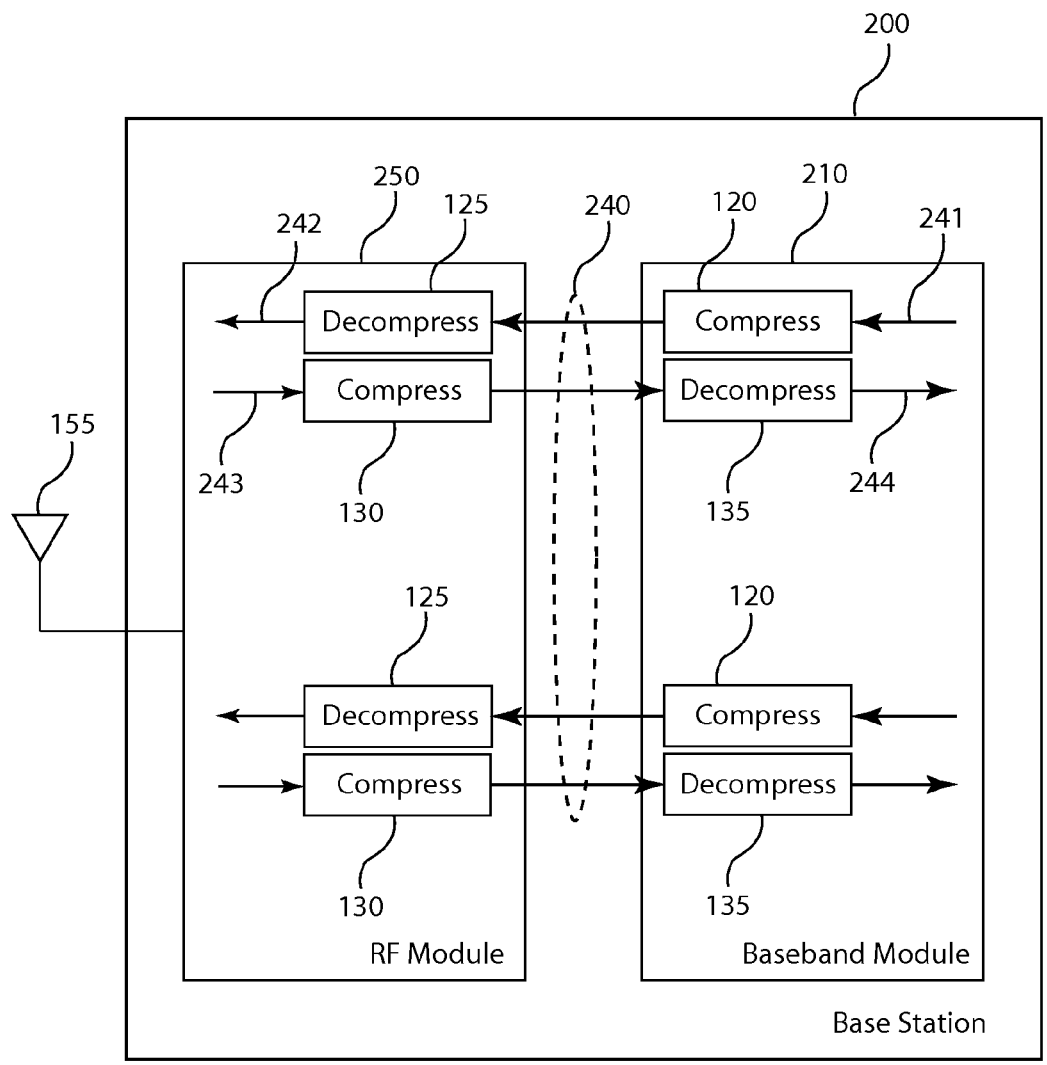
FIG. 2a is a block diagram of compression and decompression in a base station modeled after OBSAI standard.

FIG. 2a is a block diagram of compression and decompression in a base station modeled after the OBSAI standard. The OBSAI standard specifies processing and transfer of baseband I and Q signal samples. The base station 200 includes a baseband module 210 and a RF module 250 connected via one or more RP3 serial data links 240. There can be multiple baseband modules 210 in communication with multiple RF modules 250. The OBSAI architecture supports the air interface standards for GSM/EDGE, CDMA, WCDMA and WiMax for fixed or mobile access having configurations listed in Table 1 of FIG. 2c. The OBSAI standard can also accommodate other wireless network configurations or signal modulation formats by incorporating general purpose modules. The baseband module 210 performs signal processing functions on baseband signal data appropriate for the modulation format. The signal processing functions can include symbol modulation/demodulation, channel coding/decoding, spreading/despreading, diversity processing for transmission/reception, interference cancellation, equalization, time and frequency synchronization, inverse/forward discrete Fourier transform, as appropriate for the air interface standard or other modulation format, and data transport to/from an external network (not shown). The RF module 250 may contain transmit functionality only, receive functionality only, or both transmit and receive functionalities. The OBSAI RF module functions include ADC/DAC, up/down conversion, carrier selection, antenna interface, Tx/Rx RF filtering, RF combining, diversity Tx/Rx and air interface functions. Options for the serial data links 240 include fiber optic cable, copper cable or wireless transmission. The RP3 bus protocol defines the data format and line coding for data transfer. Both the baseband module 210 and the RF module 250 format the compressed data for transfer in accordance with the RP3 bus protocol.

For the transmit path, or downlink, the baseband module 210 performs various functions on communication data appropriate for the modulation format to generate baseband signal samples 241. The functions can include symbol modulation, channel coding, spreading, transmit diversity processing and inverse discrete Fourier transform as appropriate for the OBSAI supported or other signal modulation format. The compressor 120 applies frequency domain compression to the signal samples 241 before transfer via the serial data link 240 to the RF module 250. At the RF module 250, the decompressor 125 applies frequency domain decompression to the compressed coefficients to form decompressed signal samples 242 prior to the normal processing for RF transmission.

For the receive path, or uplink, the antenna 155 receives analog RF signals representing modulated communication data from the subscribers. The operations of the RF module 250 to form the baseband digital signal samples 243 will be described in more detail below with respect to FIG. 4. The compressor 130 applies frequency domain compression to the digital signal samples 243 prior to transfer via serial data link 240 to the baseband module 210. At the baseband module 210, the decompressor 135 applies frequency domain decompression to the compressed coefficients to form decompressed signal samples 244. The baseband module 210 then applies the signal processing appropriate for the modulation format to the decompressed signal samples. The signal processing functions can include symbol demodulation, channel decoding, despreading, receive diversity processing, interference cancellation, equalization, time and frequency synchronization, forward discrete Fourier transform, as appropriate for the air interface standard or other modulation format. Although FIG. 2a depicts a point-to-point arrangement other connection arrangements are possible, including mesh topologies, bridge connections and combiner/distributor connections.

Figure 2B:
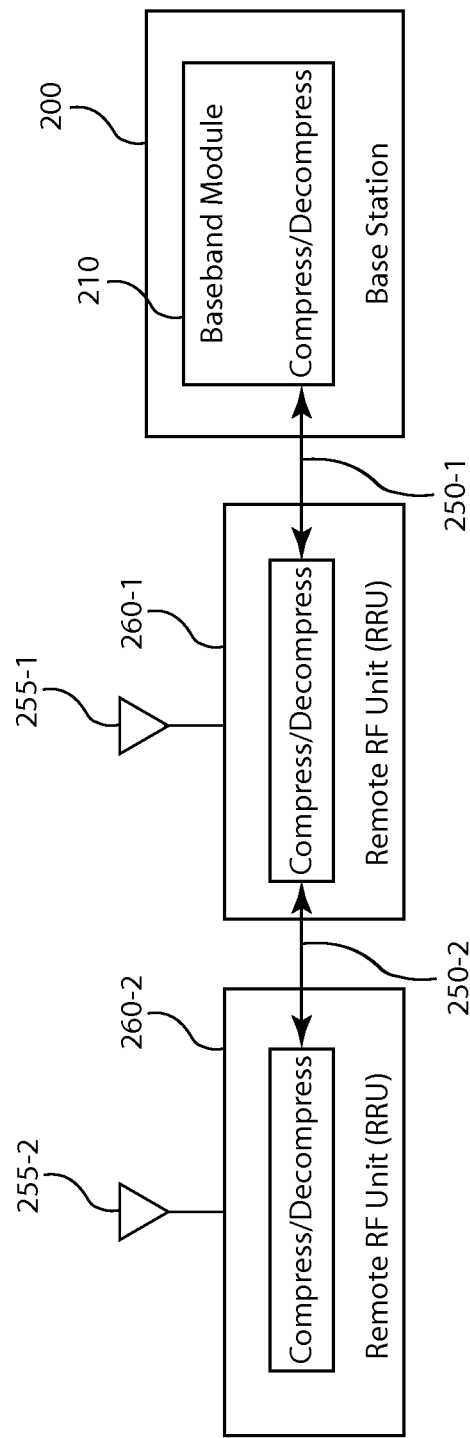
FIG. 2b is a block diagram of compression and decompression in an OBSAI compliant BTS having remote RF units.

FIG. 2b is a block diagram of compression and decompression in an OBSAI compliant BTS having remote RF units. In this example, the base station 200 is connected to two remote RF units (RRUs) 260-1 and 260-2. The serial data links 250-1 and 250-2 comply with the RP3-01 serial data link protocol as defined by the OBSAI specification. The RP3-01 protocol extends the RP3 protocol to accommodate physical layer technologies suitable for transporting data over longer physical links. A local converter (LC) implemented as a separate module or integrated with the BTS 200 or RRU 260, maps data to the RP3-01 data format. The RP3-01 protocol uses the Ethernet MAC frames in accordance with the standard IEEE 802.3-2002. A point-to-point Ethernet transfer is applied between the RP3-01 nodes, whether between RRUs 260-1 and 260-2 or between BTS 200 and RRU 260-1. The RRU 260-1 includes an Ethernet switch that determines whether a data frame is consumed at that RRU 260-1 or forwarded to the RRU 260-2. For the transmit paths, the baseband module 210 applies frequency domain compression to the payload signal data prior to transfer over the data link 250-1 in accordance with the RP3-01 protocol. If the RRU 260-1 is the destination node, the RRU 260-1 decompresses the compressed data prior to processing for RF transmission from antenna 255-1.

If the RRU 260-2 is the destination node, the RRU 260-1 passes the data frame with the compressed payload data over link 250-2 to RRU 260-2. The RRU 260-2 decompresses the compressed payload data for transmission from antenna 255-2. For the receive paths, the RRUs 260-1 and 260-2 apply frequency domain compression to their respective received signal samples and format the compressed signal data for transfer in accordance with RP3-01 protocol. The baseband module 210 applies frequency domain decompression to the compressed data received from the RRUs 260-1 and 260-2 prior to the normal baseband operations. The RRU 260-1 will pass the data frames it received from RRU 260-2 to the BTS 200 without decompressing the compressed payload data.

Figure 3A:
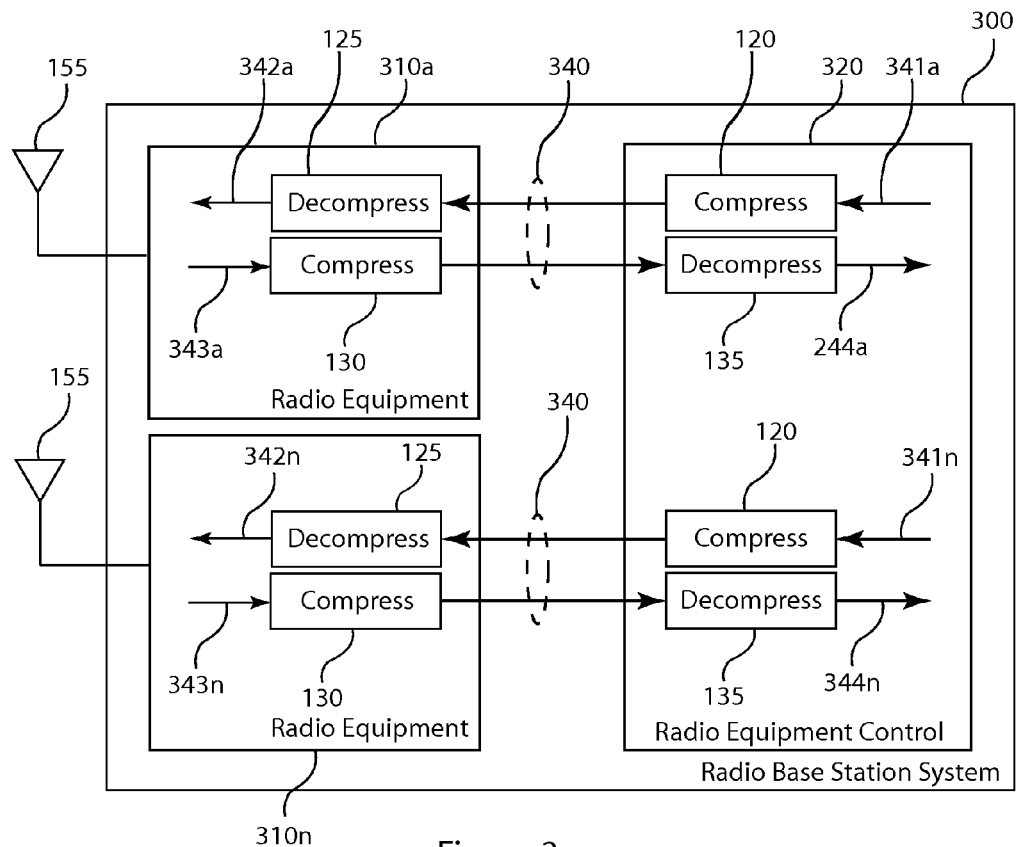
FIG. 3a is a block diagram of compression and decompression in a base station modeled after the CPRI standard.

FIG. 3a is a block diagram of compression and decompression in a base station modeled after the CPRI standard. The CPRI standard specifically supports the UTRA/FDD standard (Universal Terrestrial Radio Access/Frequency Division Duplex uses WCDMA modulation format) and the WiMax standard (IEEE802.16-2004 and IEEE802.16e-2005) but can also be used for other air interface modulation formats. In the CPRI model, the radio base station system 300 includes the radio equipment control (REC) 320 and the radio equipment (RE) 310. These two components are connected via serial data links 340 comprising bidirectional links using wire or fiber optic media. The REC 320 performs signal processing functions on baseband signal samples, including channel coding/decoding, interleaving, spreading/dispreading (UTRA/FDD) and inverse/forward discrete Fourier transform (WiMax). The RE functions prepare signal samples for the air interface or generate signal samples from the received analog signal, including ADC/DAC, up/down conversion, carrier multiplexing/demultiplexing, Tx/Rx amplification and RF filtering. The RE 310 is connected to one or more antennas 155. The CPRI standard indicates 1, 2 or 6 antennas per RE with 1-4 carriers per antenna.

Figure 3B:
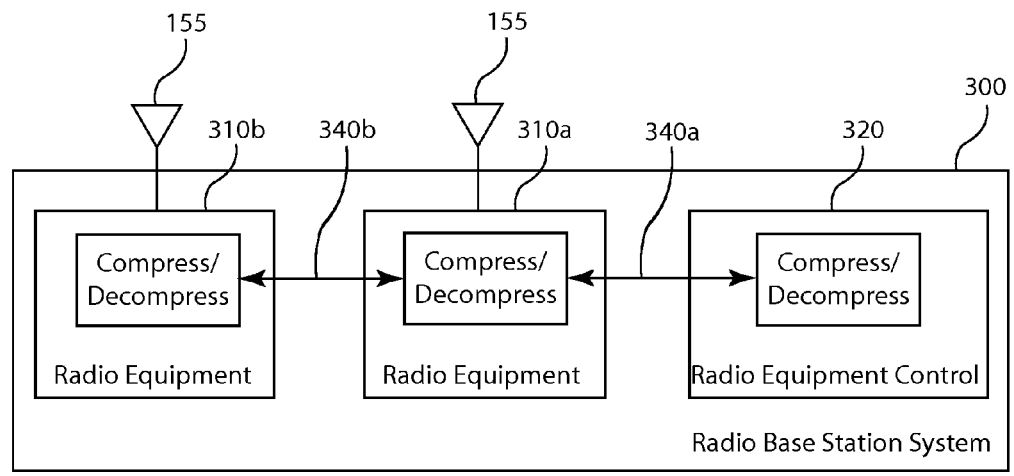
FIG. 3b shows a radio base station system 300 where the REC 320 and multiple radio equipments 310a and 310b are connected in a chain arrangement via data transfer links 340a and 340b.

For the transmit path, or downlink, from the REC 320, the compressor 120 applies frequency domain compression to the signal samples 341a to form compressed coefficients for transfer via the serial data link 340 to the RE 310. At the RE 310, the decompressor 125 applies frequency domain decompression to the compressed coefficients to produce decompressed signal samples 342a. The decompressed signal samples 342a are further processed for transmission over antenna 155. For the receive path, or uplink, the RE 310 processes signals received by the antenna 155 to form baseband digital signal samples 343a. The compressor 130 applies frequency domain compression to the signal samples to form compressed coefficients for transfer via the serial data link 340. At the REC 320, the decompressor 135 applies frequency domain decompression to the received compressed coefficients to form decompressed samples 244a. The REC 320 performs the normal processing functions on the decompressed samples 244a. The functions of the RE 310 and REC 320 are further described below with respect to FIG. 4. FIG. 3a shows a point-to-point link between the REC 320 and the RE 310. Other topologies include multiple point-to-point links between REC 320 and RE 310 and multiple point-to-point links between one REC 320 and more than one RE 310. FIG. 3b shows a radio base station system 300 where the REC 320 and multiple radio equipment units 310a and 310b are connected in a chain arrangement via data transfer links 340a and 340b. Other topologies where REs connect to each other include tree, ring, and star topologies.

Figure 4:
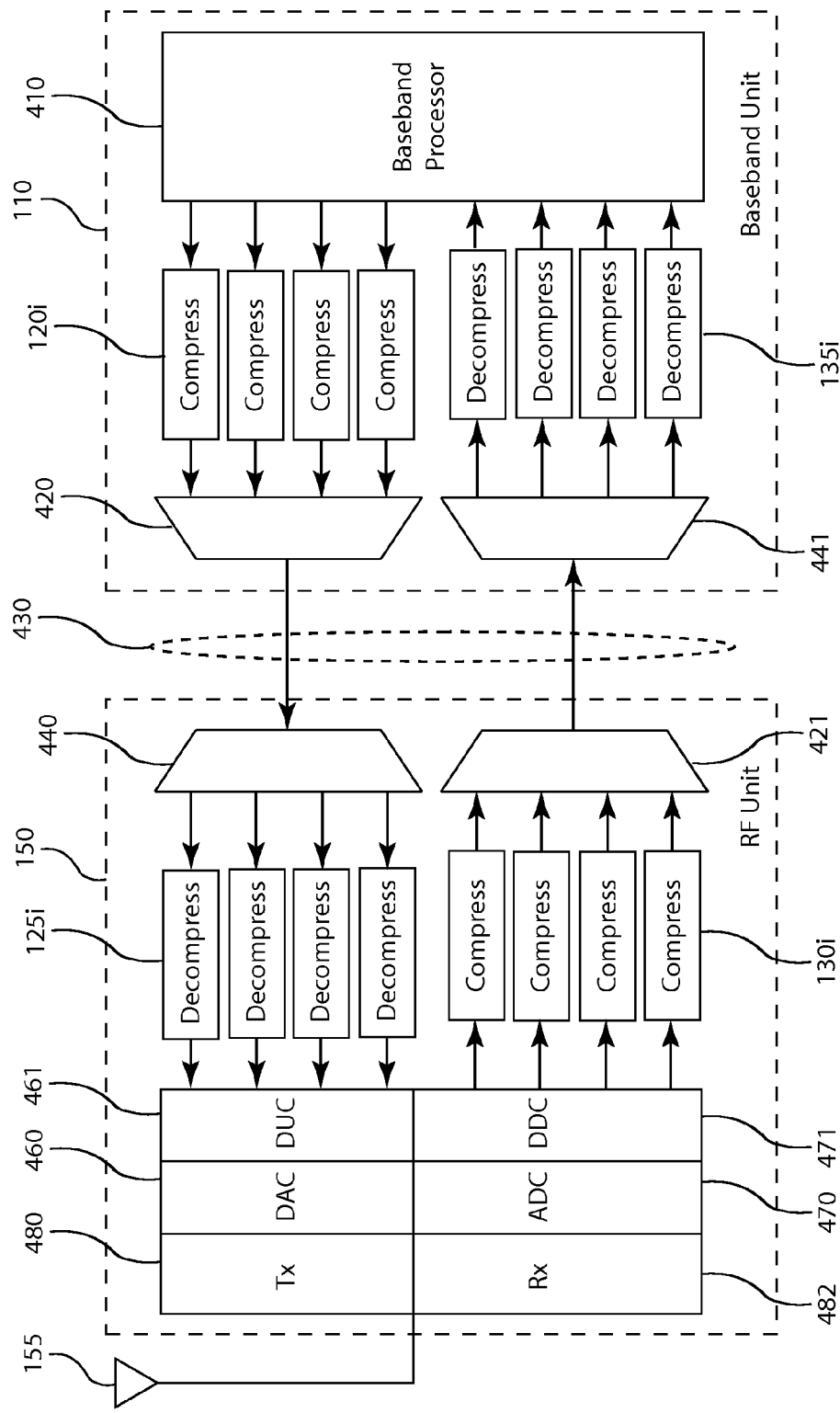
FIG. 4 is a block diagram of compression and decompression where multiple signal channels are compressed and multiplexed before transfer over a serial data link.

FIG. 4 is a block diagram of compression and decompression where multiple signal channels are compressed and multiplexed before transfer over a serial data link. Both OBSAI and CPRI transceivers receive and transmit multiple frequency channels of signal samples for each independent antenna or multiple antenna-carriers. In this example, there are four channels of signal samples representing four antenna-carriers. The signal samples comprise baseband I samples and Q samples. For the transmit path, each compressor 120i in the baseband unit 110 independently applies frequency domain compression to a corresponding stream of baseband I,Q signal samples to form a corresponding stream of compressed coefficients. The multiplexer 420 multiplexes the compressed coefficients into a single serial data stream for transfer over serial data link 430 in accordance with the standard. At the RF unit 150, the demultiplexer 440 demultiplexes the serial data stream to recover the four streams of compressed coefficients in accordance with the standard. Each decompressor 125i applies frequency domain decompression to one stream of compressed coefficients to reconstruct the corresponding baseband I,Q signal samples. The digital upconverter (DUC) 461 upconverts each stream of decompressed signal samples to respective carrier frequencies to form a channelized signal. Each upconverted digital signal occupies a particular channel of the resulting channelized signal. The DAC 460 converts the channelized signal to an analog signal. The transmitter 480 converts the analog signal to the appropriate RF frequency for transmission by the antenna 155. For the receive path, the receiver 482 receives the RF signal and the ADC 470 digitizes the received signal to produce a digital signal that represents a channelized signal data as described for the transmit path. The digital down converter (DDC) 471 downconverts each channel to form corresponding streams of baseband I,Q signal samples, one for each channel. The compressor 130i applies frequency domain compression to its input signal samples to form compressed coefficients. The multiplexer 421 multiplexes the streams of compressed coefficients output from the compressors to form a serial data stream in accordance with the OBSAI or CPRI standards. The serial data stream is transferred via the serial data link 430 to the baseband unit 110. The demultiplexer 441 demultiplexes the serial data to restore the four streams of compressed coefficients. Each decompressor 135i reconstructs the corresponding I,Q signal samples prior to the normal operations by the baseband processor 410.

The compressors 120i and 130i organize the compressed coefficients into compressed data packets compatible with the OBSAI, CPRI or other protocols. The compressed data packets represent the compressed real and imaginary (or I and Q) components. The order of the compressed coefficients may be sequential interlaced compressed real and imaginary components, i.e. ($Re_1$ $Im_1$ $Re_2$ $Im_2$ ... $Re_N$ $Im_N$). Alternatively, the order of the compressed real and imaginary components may have blocks of compressed real components followed by blocks of compressed imaginary components, i.e. ($Re_1$ $Re_2$ ... $Re_N$ $Im_1$ $Im_2$ ... $Im_N$).

The compressor 120i/130i may add a header portion to some or all of the compressed data packets. The header portion has a defined length, for instance 16 bits. Alternatively, the header information can be placed in overhead fields of the OBSAI or CPRI message format. In an alternative for OBSAI, header information can be encoded using unused codes of an OBSAI message's TYPE field. In an alternative for CPRI, header information can be encoded in stuffing bits of the basic frame. The compressor 120i/130i provides the compressed data packet to the payload portion of the OBSAI or CPRI message format. The decompressor 125i/135i receives the OBSAI or CPRI message and extracts the compressed data packet from the payload portion. The decompressor 125i/135i uses the header to extract control parameters for decompression and to establish compressed data packet synchronization. The decompressor 125$i$/135$i$ reconstructs the sequence of I,Q signal samples in the I and Q sample order, byte order and data format specified by the OBSAI, CPRI or other protocol. Control messages used by OBSAI or CPRI are not compressed.

Figure 5:
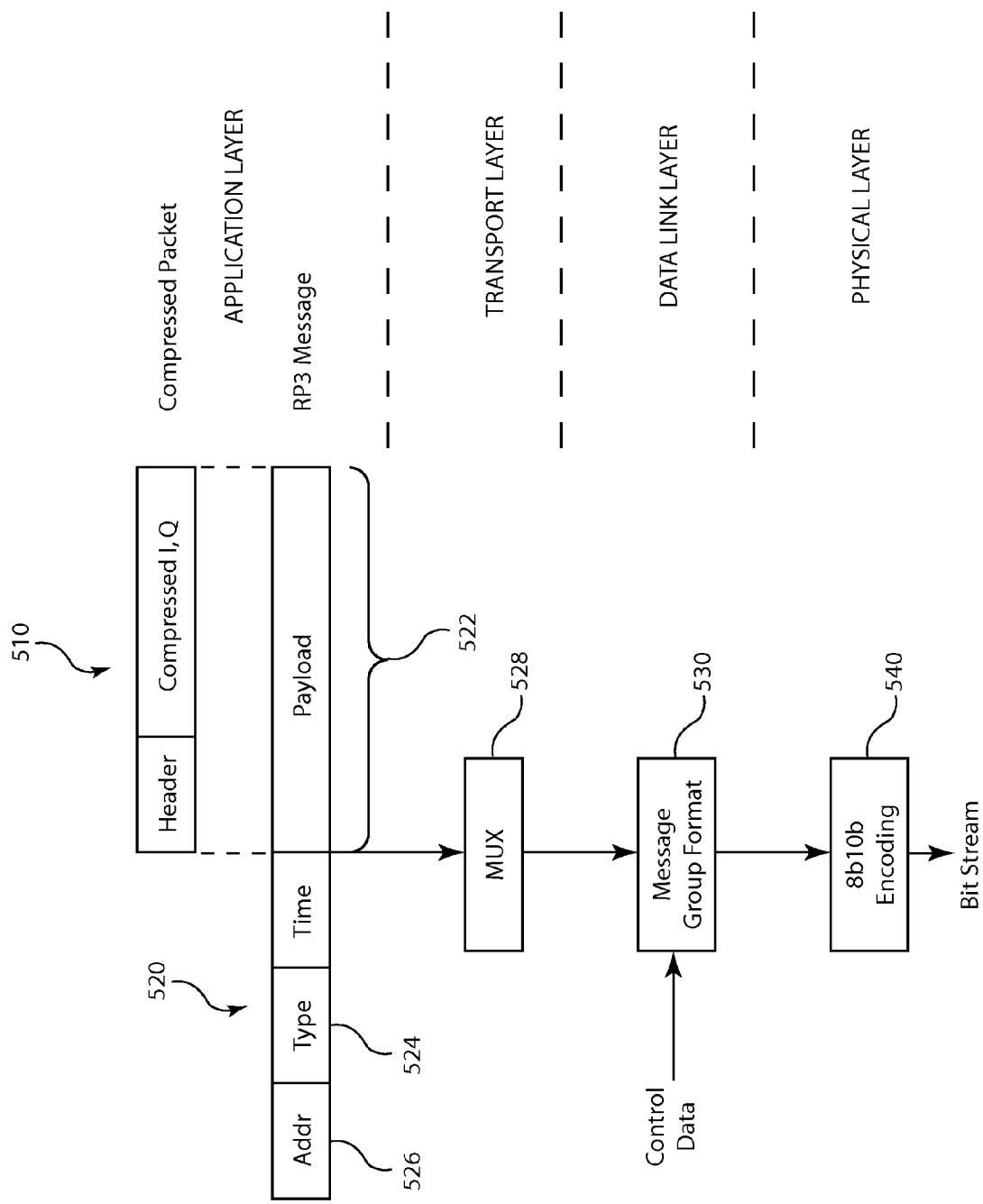
FIG. 5 illustrates an example of mapping a compressed data packet to the payload portion of an RP3 message.

The OBSAI standard's RP3 and RP3-01 bus protocols include features useful for transfer of compressed data packets. The OBSAI application layer message format has a fixed size of 19 bytes, or 152 bits, including 3 bytes allocated for address/type/timestamp and 16 bytes, or 128 bits, allocated for payload. The type fields include W-CDMA/FDD, W-CDMA/TDD, 802.16, LTE (Long Term Evolution) and Ethernet. A compressed data packet can be set to a length of 128 bits to fit the payload portion. The OBSAI physical layer applies 8b/10b encoding to each byte of the message, including the payload, prior to transfer over the data link. The RP3 protocol defines a message group that includes up to 65,536 messages and up to 20 idle bytes and a frame including up to an integer multiple times 65,536 consecutive message groups, where the integer multiple is 1, 2 or 4. The integer multiple relates the frame length in bits to the data transfer rate of the serial data links of 768 Mbps (i=1), 1536 Mbps (i=2) and 3072 Mbps (i=4). The time interval for a frame is fixed at 10 msec. FIG. 5 illustrates an example of mapping a compressed data packet 510 to the payload portion 522 of an RP3 message 520. The compressed data packet 510 contains the compressed real (or I) and imaginary (or Q) components of the frequency domain coefficients. The type field 524 indicates the data type of the signal samples, for example W-CDMA/FDD. The address 526 is used for routing at the transport layer. The transport layer function includes the message multiplexer 528 that multiplexes RP3 message 520 with other RP3 messages (not shown) in accordance with the system configuration and routing requirements. At the data link layer, the message group formatter 530 assigns multiple messages to message slots and adds control data and idle bytes to form a message group. At the physical layer, the 8b/10b encoder 540 encodes each byte to 10 bits to form a portion of the bit stream for transfer over the serial data link. Referring to FIG. 4, for OBSAI systems, the multiplexers 420 and 421 perform the functions described with respect to FIGS. 5 and 6 on the compressed data packets 510 from each group of compressors 120$i$ and 130$i$. For OBSAI systems, the demultiplexers 440 and 441 perform the inverse operations, including 8b/10b decoding, message demultiplexing and extracting the payload data from the RP3 message 520 to retrieve the compressed data packet 510. The corresponding compressed data packets are input to decompressors 125$i$ and 135$i$.

For example, a 10 msec. OBSAI frame accommodates 38,400 chips for W-CDMA signals. For data rates of 768 Mbps, 1536 Mbps, and 3072 Mbps and 8b/10b encoding, the user data transferred during 10 msec. have 6.144 Mbits, 12.288 Mbits, and 24.576 Mbits. Each antenna-carrier uses 3.84 MHz*32 bits*1.25=153.6 Mbps of link bandwidth. Thus, a 768 Mbps link can carry 4 antenna-carriers (16 bits I, 16 bits Q). For a compression ratio of 2:1, the 768 Mbps link will carry 8 antenna-carriers.

Figure 6:
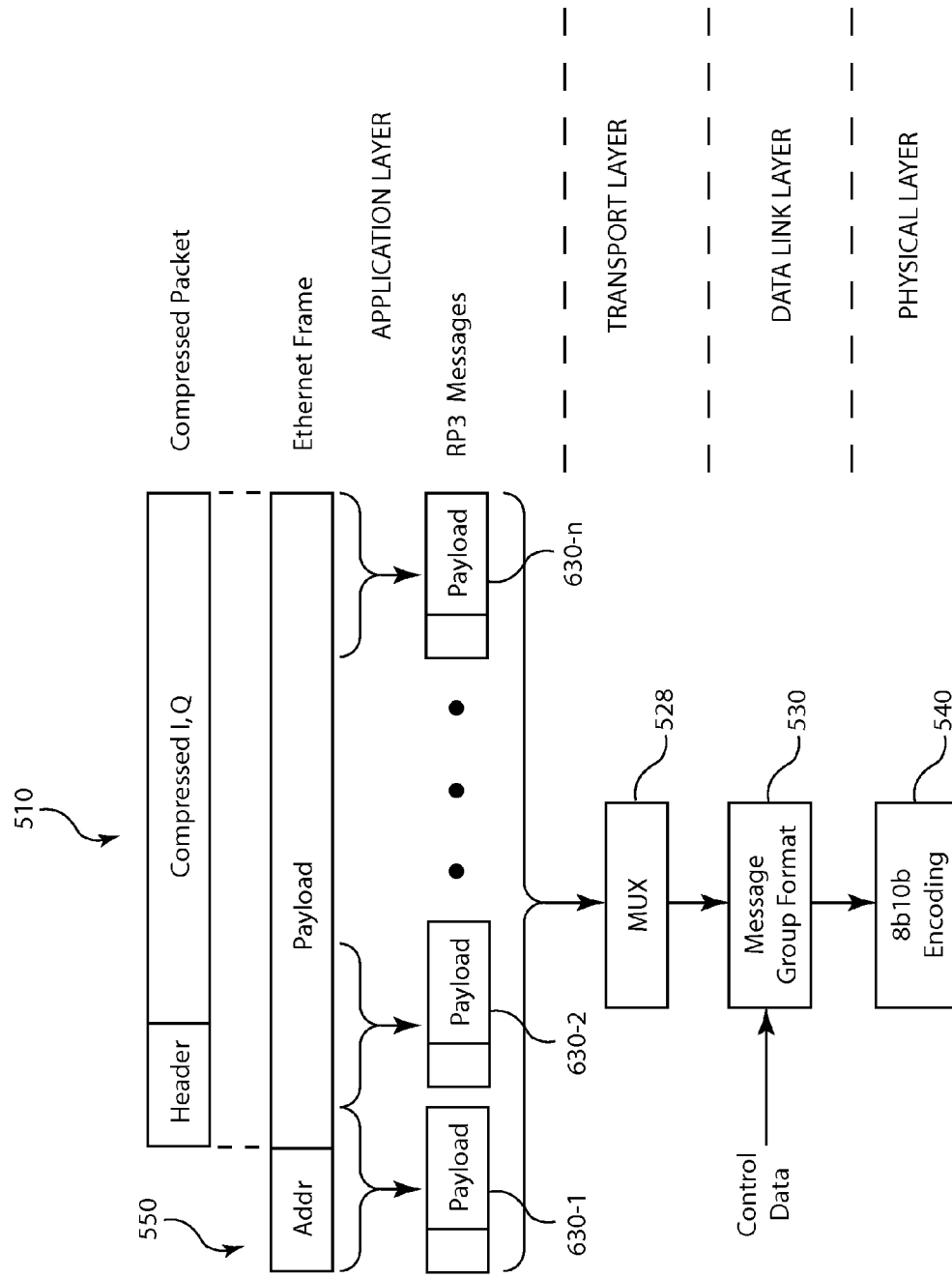
FIG. 6 illustrates an example of mapping a compressed data packet to an Ethernet MAC frame and then to RP3 messages.

FIG. 6 shows an example of mapping a compressed data packet 510 to an Ethernet MAC frame 550 and then to RP3 messages 630-$x$ supported by the OBSAI standard. For the BTS connected to multiple RRUs, the RP3-01 protocol specifies mapping Ethernet MAC frames to consecutive RP3 messages along with control data. Ethernet MAC frame sizes are between 64 bytes and 1518 bytes, with 14 bytes for the header and payload sizes between 46 bytes and 1500 bytes. As shown in FIG. 6, compressed data packets 510 may be mapped to payload portions of Ethernet MAC frames 550. The contents of the Ethernet MAC frames 550 are then mapped to the payload portions of RP3 messages 630-1 to 630-$n$. The RP3 messages 630-1 to 630-$n$ are multiplexed as described with respect to FIG. 5.

The OBSAI standard also supports custom data types for RP3 messages. Since type values 01111-11111 are not assigned, the user can assign one of the type values to a custom message that contains compressed data in the payload portion. Referring to FIG. 5, the type field 524 can be assigned the type value corresponding to the custom message. The user can specify additional parameters for message groups containing custom messages, including the number of messages per message group (M_MG), the minimum number of message groups per frame (N_MG) and the number of idle codes per message group (K_MG).

The CPRI specification defines a basic frame having a duration of 1/3.84 MHz, or 260.416667 nsec. The basic frame includes 16 words, one word contains control data and the remaining 15 words, referred to as the IQ data block, contain baseband I,Q signal samples. The word length in bits depends on the data transfer rate of the link. The IQ data block size in bits equals 15 times the word length, so capacity of a basic frame depends on the data transfer rate. The CPRI Specification V4.1 indicates data transfer rates of 614.4 Mbps, 1228.8 Mbps, 2457.6 Mbps, 3072.0 Mbps, 4.915 Mbps, and 6.144 Mbps with respective word lengths of 8, 16, 32, 40, 64 and 80 bits. The CPRI standard allows varying sample widths for signal samples for the downlink (8 to 20 bits per sample) and the uplink (4 to 20 bits per sample). The sample width is the number of bits per sample. Each I,Q signal sample consists of one I sample having the sample width and one Q sample having the same sample width. The sample widths are determined at the application layer. The flexibility of sample width is beneficial for accommodating compressed coefficients. The CPRI protocol organizes signal data into packets called AxC containers. Each AxC container includes I and Q samples corresponding to one antenna-carrier (AxC). The AxC corresponds to data provided to or received via one carrier of one independent antenna element. The AxC container holds the I,Q samples for the duration of one UMTS chip. For WiMax, the AxC container holds the I,Q samples and sometimes additional stuffing bits. The AxC containers from several different AxCs are multiplexed together to form AxC container groups. The AxC container groups are mapped to the I,Q data block of the basic frame.

Figure 7:
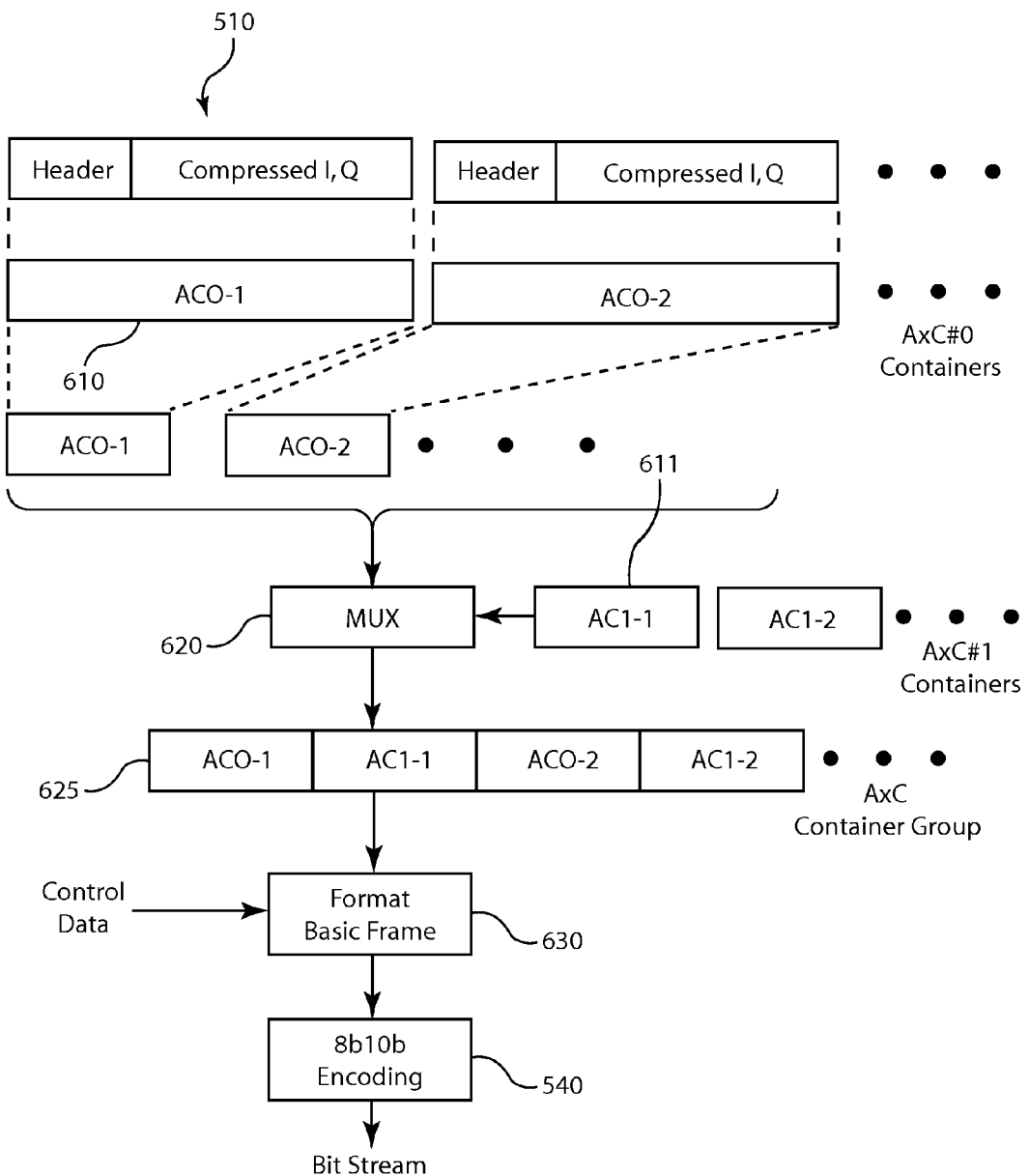
FIG. 7 shows an example of mapping compressed data packets for transfer according to the CPRI protocol.

FIG. 7 shows an example of mapping compressed data packets for transfer according to the CPRI protocol. Each compressed data packet 510, containing compressed real (or I) and imaginary (or Q) components of the frequency domain coefficients from the same antenna-carrier, is mapped to an AxC container 610. The consecutive AxC containers AC0-1 and AC0-2 correspond to a first antenna-carrier, AxC#0. Each AxC container 611 holds a compressed data packet from a second AxC, AxC#1. The multiplexer 620 multiplexes the AxC containers from the two antenna-carriers to form an AxC container group 625. The basic frame formatter 630 forms a basic frame having a number of AxC container groups in the IQ data block and adding the control word. The 8b/10b encoder 540 applies an 8b/10b code to each byte of data in the basic frame. Referring to FIG. 4, for CPRI systems, the multiplexers 420 and 421 perform the functions described with respect to FIG. 7 on compressed data packets 510 output from each group of compressors 120$i$ and 130$i$. The demultiplexers 440 and 441 perform the inverse operations, including 8b/10b decoding, demultiplexing AxC containers from the AxC container groups and extracting the compressed data packets 510 from the AxC containers. The CPRI standard supports between 4 and 24 AxCs per RE. Compression could enable the use of fewer media connections (cables) between RECs and REs, lowering physical connection costs and allowing existing CPRI links to support additional AxCs.

The serial data transfer link 430 can be implemented using several types of cabling or using wireless transmission. For long distances single mode or multi-mode fiber optic cabling may be used, while for shorter links CAT5/6, other twisted pair cabling, or coax may be used. Multiple RF bands transmitted as digital data streams can be time multiplexed on optical fiber links.

When the baseband signals are oversampled, compression can reduce the frequency domain coefficients outside the signal bandwidth and improve data transfer efficiency. Oversampling is indicated when the number of samples per symbol or chip is greater than one. The oversampling ratio is the ratio of the sample rate to the symbol rate or chip rate. When the oversampling ratio is greater than one, the signal is oversampled. For example, the CPRI standard specifies sampling the received analog signal with an oversampling ratio 2 or 4 samples per chip for the UTRA/FDD uplink. For another example, the OBSAI standard specifies oversampling the uplink WCDMA signal by an oversampling ratio of 2 samples per chip.

In many cases, lossy compression can be applied to the signal samples while maintaining system quality metrics. For lossless compression, the decompressed signal samples are identical to the original signal samples. For lossy compression, the decompressed signal samples are approximations of the original signal samples. System quality metrics typically include composite error vector magnitude (cEVM), peak code domain error (PCDE), spectral emissions mask (SEM), adjacent channel leakage ratio (ALCR), bit error rate (BER) and block error rate (BLER). The oversampling and/or sample widths of the signal samples may be greater than necessary to meet system requirements for signal quality. Lossy compression can provide a greater reduction in data transfer capacity while the important metrics of signal quality are preserved.

Figure 8:
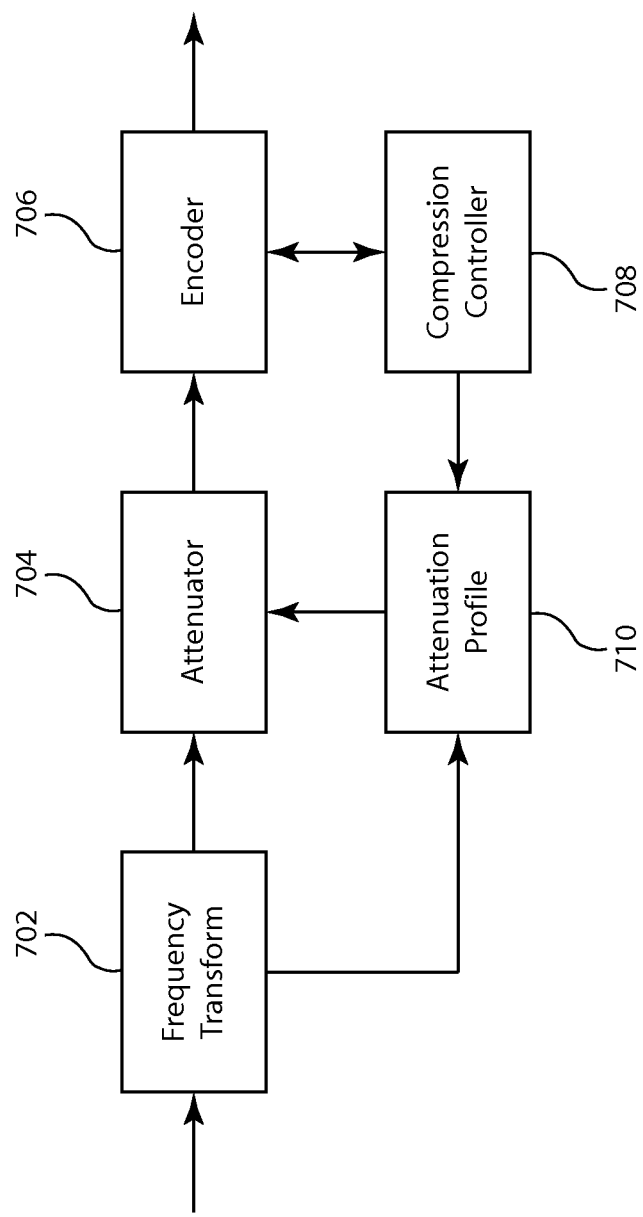
FIG. 8 is a block diagram of the frequency domain compression, in accordance with a preferred embodiment.

FIG. 8 is a block diagram of the frequency domain compression, in accordance with a preferred embodiment. In the preferred embodiment, compressors 120/120i and 130/130i described above apply frequency domain compression to the signal samples to form the compressed coefficients. The frequency transform unit 702 calculates a frequency domain transform of a sequence of input signal samples to form frequency domain coefficients. The frequency domain transform is preferably a discrete Fourier transform (DFT) or a fast Fourier transform (FFT), which is a computationally efficient calculation of the DFT. Alternative transforms include the discrete cosine transform (DCT) and the discrete sine transform (DST). The length of the frequency domain transform is preferably not greater than 2048 samples. The frequency domain coefficients are complex-valued, having a real (or I) component and an imaginary (or Q) component for each frequency bin. The attenuator 704 reduces the amplitude of one or more of the frequency domain coefficients in accordance with an attenuation profile 710. The attenuation profile may indicate a number of least significant bits (LSBs) that are truncated from the frequency domain real and imaginary components as a function of the frequency bin index. In this case, the truncations are implemented by simple bit shifting operations. Alternatively, the attenuation profile may indicate a reduction by a fractional number of bits. In this case, the attenuations are implemented by multipliers and shifters.

The attenuator 704 applies the attenuation profile 710 by multiplying and/or shifting the real and imaginary components by the corresponding attenuation values. Multiplying along with shifting allows fractional attenuation values in the floating point range {0.0, 1.0}. For example, representing the floating point attenuation values of the attenuation profile using R bits provides $2^R$ attenuation levels in the range {0.0, 1.0}. The attenuation levels themselves can be stored in a lookup table in memory and provided to the attenuator 704. Alternatively, the attenuator 704 can calculate the attenuation values using parameters defining the attenuation profile 710, such as slopes and segment endpoints, stored in memory. A simple embodiment of the attenuator 704 includes right shifting the samples by the number of bits corresponding to the attenuation values. Shifting alone reduces the magnitudes of the samples by factors of 2, since a right shift corresponds to a division by two. The right shifts will shift out a corresponding number of least significant bits, thus reducing the number of bits used to represent the sample. The right shift values corresponding to the attenuation values can be stored in a lookup table or calculated by the attenuator 210 based on parameters of the attenuation profile 214.

Figure 9:
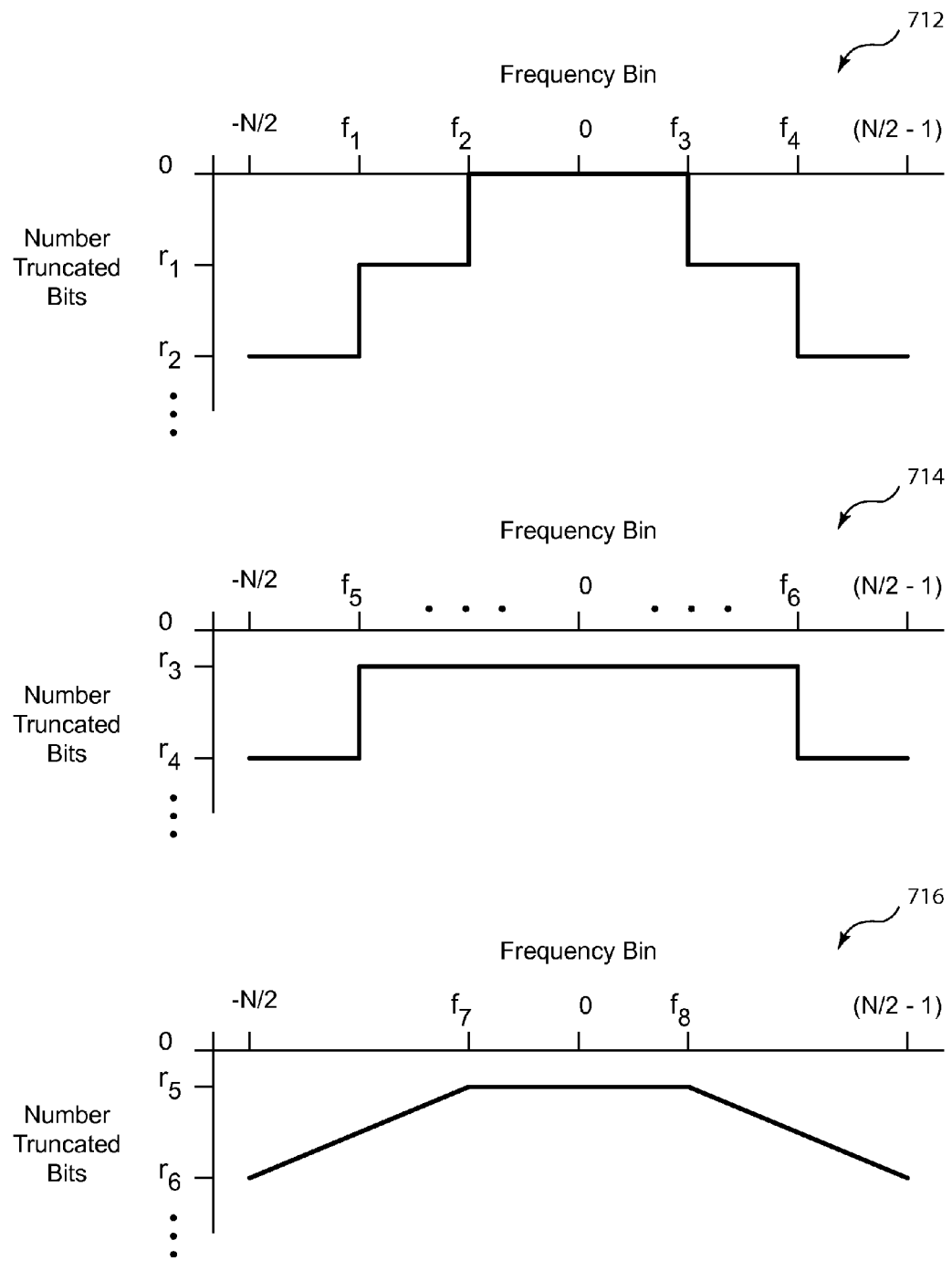
FIG. 9 shows graphs of exemplary frequency domain attenuation profiles.

FIG. 9 illustrates several graphs of exemplary frequency domain attenuation profiles. The horizontal axis for each graph corresponds to the frequency bin of the frequency domain transform, such as the FFT. The frequency bin indices range from $-N/2$ to $(N/2-1)$ for an N-length FFT. The vertical axis indicates the attenuation level as a function of frequency bin index. For the graph 712, from frequency bins $-N/2$ to $f_1$ and from $f_4$ to $(N/2-1)$, the attenuation level applied to the real and imaginary components is $r_2$. From frequency bins $f_1$ to $f_2$ and from $f_3$ to $f_4$ the attenuation level applied to the real and imaginary components is $r_1$. The real and imaginary components for frequency bins between $f_2$ and $f_3$ keep their original values. For the graph 714, the attenuation level is $r_4$ for the frequency bins less than $f_5$ or greater than $f_6$ and is $r_3$ for the frequency bins from $f_5$ to $f_6$. For the graph 716, the attenuation level is a linear function of the frequency bin index from $-N/2$ to $f_7$ and from $f_8$ to $(N/2-1)$, and the same level $r_5$ from $f_7$ to $f_8$. The parameters of the attenuation profile, such as $f_1$ to $f_6$ and $r_1$ to $r_6$, may be determined dynamically and/or based on a priori information.

Wireless communication systems are susceptible to multipath fading of the transmission channel. In multipath induced fading, different frequency bins may be affected differently by the multipath propagation of the signal on the channel. As such, the signal strength at the receiver may be different for each of the frequency bins and the signals of some of the frequency bins may have a higher received signal strength than those of other frequency bins. Fading of the channel may cause poor performance in the wireless communication network because fading of the channel strongly influences the signal-to-noise ratio of the transmission channel. As the signal-to-noise ratio drops, in response to strong fading in the channel, the bit error rate will increase and the performance of the network will be negatively affected. To reduce the bit error rate and therefore improve the performance of the communication system, it may be advantageous to maintain a desired signal-to-noise ratio at each of the frequency bins. In order to maintain a desired signal-to-noise ratio, a lower attenuation level for compression may be applied to the frequency bins exhibiting a lower signal strength and a higher attenuation level for compression may be applied to the frequency bins exhibiting a higher signal strength. The attenuation levels necessary to maintain a desired signal-to-noise ratio may be included in the attenuation profile for compression. As such, the attenuation profile reflects the signal strength of the received signal wherein the attenuation profile specifies a lower attenuation level to be applied to the frequency bins exhibiting a weaker received signal strength and a larger attenuation level to be applied to the frequency bins exhibiting a stronger received signal strength.

Figure 13:
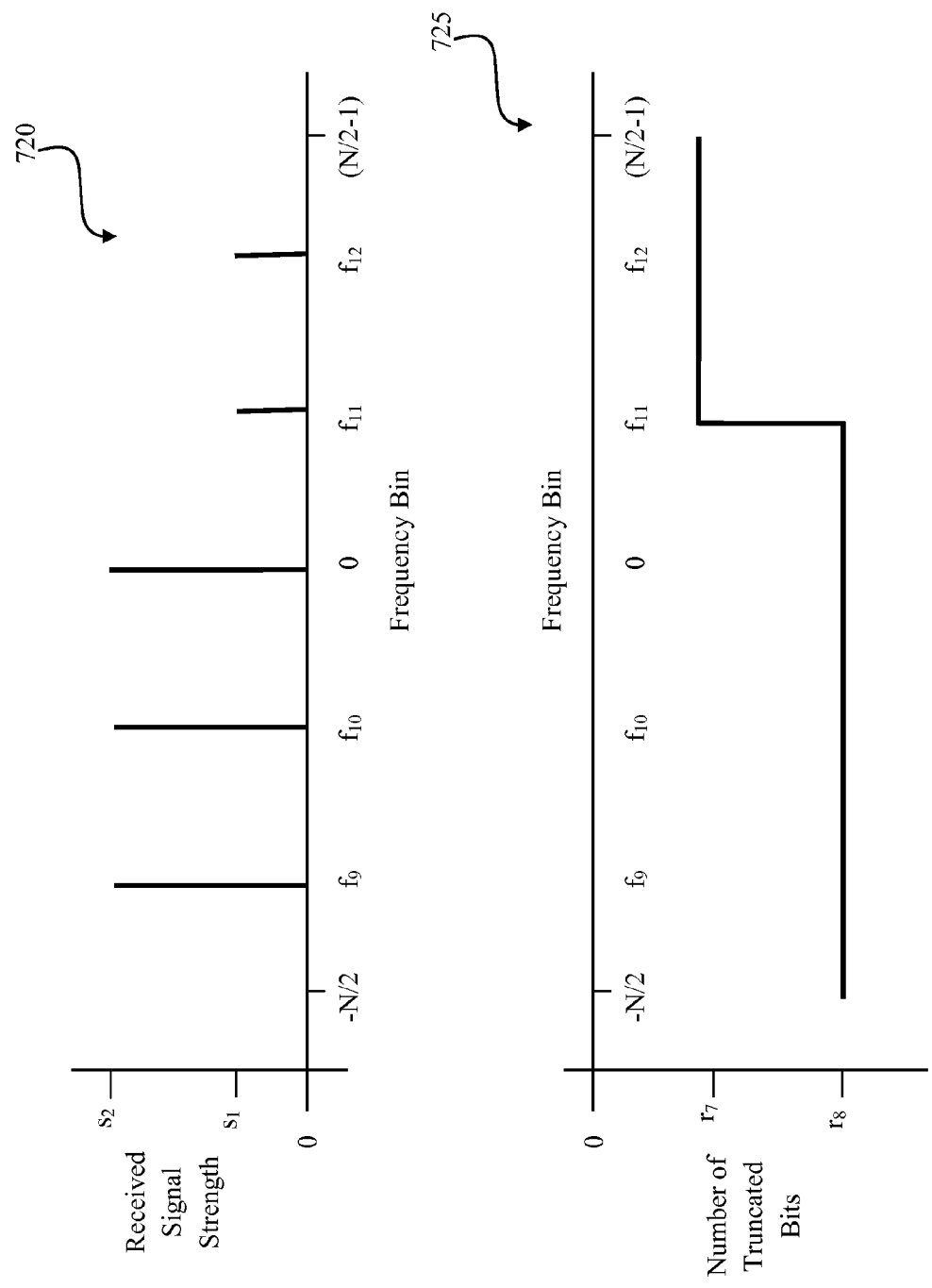
FIG. 13 illustrates an exemplary attenuation profile reflecting the signal strength of a received signal.

FIG. 13 illustrates a graph of the received signal strength at each of the frequency bins and a graph of an exemplary frequency domain attenuation profile that reflects the signal strength of the received signal to maintain a desired signal-to-noise ratio. The horizontal axis for each graph corresponds to the frequency bin of the frequency domain transform, such as the FFT. The frequency bin indices range from $-N/2$ to $(N/2-1)$ for an N-length FFT. The vertical axis indicates the attenuation level as a function of the frequency bin index. For the graph 720, the received signal strength is $s_1$ from frequency bins $-N/2$ to $f_{11}$ and the received signal strength is $s_2$ from $f_{11}$ to $(N/2-1)$. To accommodate for the difference in signal strength of the received signal at frequency bins $f_9$ to $f_{12}$, the frequency domain attenuation profile illustrated in the graph 725 is applied to the received signal in the frequency domain. For the graph 725, from frequency bins $-N/2$ to $f_{11}$, the attenuation level applied to the real and imaginary components is $r_7$. From frequency bins $f_{11}$ to $(N/2-1)$, the attenuation level applied to the real and imaginary components is $r_8$. Accordingly, the attenuation levels set in the attenuation profile can be used to compensate for the fading channel and to maintain a desired signal-to-noise ratio.

The attenuation profiles may be determined in advance based on frequency domain characteristics of the signal, signal quality metrics, and/or desired output bit rate of the compressed data. The signal modulation format affects the frequency domain characteristics of the signal samples. For example, the signal modulation format may include an inactive subcarrier, or inactive subband, corresponding to one or more of the frequency bins. Guard band specifications also indicate unused portions of the spectrum. When there are inactive subcarriers or guard bands, the attenuation levels for the corresponding frequency bins may be greater than the attenuation levels corresponding to the active subcarriers. Oversampling of the signal also affects the frequency domain characteristics of the signal samples. For modulation formats where the baseband signal is oversampled, as described above, the frequency domain coefficients near the positive edge $(N/2-1)$ and negative edge $(-N/2)$ are outside the bandwidth of the desired baseband signal. For example, referring to the graph 714 in FIG. 9, suppose the bandwidth of the baseband signal is from $f_5$ to $f_6$ and the frequency bins from $(-N/2)$ to $f_5$ and from $f_6$ to $(N/2-1)$ represent excess frequency bands due to oversampling. The frequency domain coefficients of the excess frequency bands are attenuated more, by attenuation level $r_4$, than those from $f_5$ to $f_6$ corresponding to the baseband signal. The modulation format may be included in the control information associated with the received signal samples at the RF unit 150 for the uplink or with the signal samples at the baseband processor for the downlink. The compression controller 708 may use the modulation format information to select an appropriate attenuation profile.

The attenuation profiles can be matched channel by channel or can be the same for all the channels depending on the design of the BTS. For example, if the BTS processes signals having the same modulation format for all the channels, then the attenuation profiles can be the same for all the channels. If the BTS processes signals having different modulation formats, i.e. OBSAI and CPRI, then the attenuation profiles can be different for the different channels based on the modulation format for each channel. If the compressor uses feedback control to achieve a fixed compression ratio (described below), then the attenuation profiles are adjusted channel by channel.

The attenuation profile may also be determined dynamically by measuring the magnitudes of the frequency domain coefficients and selecting attenuation levels based on the magnitudes. The attenuation profile may be fixed or may vary based on feedback parameters provided by the compression controller 708. The parameters of one or more attenuation profiles 710 may be stored in a buffer or memory accessible by the attenuator 704.

Returning to FIG. 8, the encoder 706 may apply Huffman encoding, block floating point encoding or other encoding technique to the attenuated coefficients to produce compressed coefficients. The block floating point encoding or Huffman encoding provides additional compression to the attenuated coefficients. Alternatively, the encoder 706 may pack the attenuated coefficients sequentially, since the number of bits per sample is a known function of the frequency bin as represented by the attenuation profile.

The preferred block floating point encoding is described in the following, where the "samples" refer to the attenuated frequency domain coefficients output from the attenuator 704. The following steps are applied to BLOCK_SIZE samples, each BLOCK_SIZE divided into groups of N_group samples, where S is the original number of bits per sample:

For the first group of samples:
1) Determine the exponent (base 2) for the sample with the maximum magnitude, such as by calculating the $\log_2$ of the maximum magnitude. This indicates the number of bits per encoded sample in the group, or n_exp(0).
2) Absolute encode the exponent n_exp(0) of the first group using S bits.
3) Encode the N_group samples using n_exp(0) bits per sample.

For the $i^{th}$ group of N_group samples:
4) Determine the $i^{th}$ exponent (base 2) for the sample with the maximum magnitude, which indicates the number of bits per encoded sample in the $i^{th}$ group, or n_exp(i);
5) Differentially encode the $i^{th}$ exponent by subtracting n_exp(i) from n_exp(i−1) to determine the first token in the $i^{th}$ group of encoded samples.
6) Encode the $i^{th}$ group of N_group samples using n_exp(i) bits per sample.

For the first group of samples in the BLOCK_SIZE samples, the exponent n_exp(0) is absolute encoded. For example, the exponent n_exp(0) can be encoded as follows, where S is the original number of bits per sample:
0: n_exp(0)=0 (all 4 sample values are zero)
1: n_exp(0)=2 (2 bits per sample)
2: n_exp(0)=3 (3 bits per sample)
etc. until S−1: n_exp(0)=S (S bits per sample)

For the $i^{th}$ group, the exponent n_exp(i) is differentially encoded using a prefix code, where no codeword is the prefix of another codeword. The preferred differential encoding is as follows:
1. Calculate difference: e_diff=n_exp(i)−n_exp(i−1)
2. Encode e_diff as follows:
0: e_diff=e(i)−e(i−1)
101: e_diff=+1
110: e_diff=−1
1001: e_diff=+2
1110: e_diff=−2
Etc.

Alternative techniques for block floating point encoding are described by Wegener in the U.S. patent application Ser.

No. 12/605,245 entitled, "Block Floating Point Compression of Signal Data," filed on Oct. 23, 2009.

The compressed coefficients may be packed to form compressed data packets that include control data in the packet header, as described above. The compressed packets may be further formatted in accordance with a data transfer protocol for the serial data link 140. The compressed data packets produced by multiple compressors 120i may be multiplexed for transfer over the serial data link 430, as described with respect to FIG. 4. The serial data links 140 or 340 may be custom, proprietary or industry standard links Depending on the link protocol, formatting operations can include 8b/10b encoding, insertion into an Ethernet MAC frame or other formatting.

The compression controller 708 provides compression control parameters for setting and modifying the attenuation profile 710 and parameters for the encoder 706. The compression controller may measure the bit rate of the compressed coefficients and adjust at least one attenuation level of the attenuation profile so that the compressed bit rate falls within a desired range or is maintained at a desired level. The compression controller can subtract an average compressed bit rate from a desired bit rate to determine an error. The error, or a number of excess bits, can be used to determine adjustments in the parameters of the attenuation profile 710, such as the parameters $r_i$ and/or $f_i$ of the examples 712, 714 and 716 given in FIG. 9.

The optimum compression parameters for the wireless communication signals that meet system quality requirements can be determined in advance. The compression alternatives can include lossless and lossy compression. Control parameters based on the modulation type, sample rate (or oversampling ratio), bandwidth and sample width can be used to configure the compression and decompression operations. The control parameters for the various types of signals served by the BTS can be determined by testing. The control parameters can then be set based on the modulation type. For example, in the OBSAI standard the type field in the RP3 message indicates the signal type, or modulation type. Since the OBSAI standard specifies the sample rate and sample width based on the modulation type, a compression/decompression controller can use the type information to select the corresponding control parameters for the compressor/decompressor. The user can also select lossless or lossy modes. For instance, selecting an attenuation parameter for reducing the amplitudes of the frequency domain coefficients will result in lossy compression. The user can also select a fixed-rate lossy mode, where the bit rate of the compressed data is constant.

The application layer for the base station processor and the RF unit includes the air interface applications for the various types of wireless signals. For example, in the OBSAI standard, the application layer determines the signal type, or modulation type, and encodes it for the type field of the RP3 message. The compression operations augment the conventional operations of the application layer, so information on the modulation type is available to the compression controller 708. The compression controller 708 may use the modulation type information to determine control parameters for the frequency transform 702, attenuation profile 704 and encoders 706. The control parameter for the frequency transform may indicate the length of the transform. The control parameter for the attenuation profile may indicate initial values for the frequency bin indices $f_i$ and the attenuation levels $r_i$. The control parameter for the encoders 706 can indicate parameters for the block floating point encoder, such as number of bits per sample S, the group size and BLOCK_SIZE.

Some modulation formats for wireless communications designate certain subcarriers in the frequency domain as inactive. Generally, the inactive subcarriers are located on both sides of the baseband signal spectrum and may be referred to as guard carriers or guard bands. The active subcarriers include information bearing subcarriers and pilot subcarriers, if any, are centered around 0 Hz in the baseband signal spectrum. Wireless communications in accordance with protocols for WiMAX and LTE are based on OFDM formats and include designated inactive subcarriers. To achieve greater compression, the attenuation levels $r_i$ for the frequency bins $f_i$ corresponding to inactive subcarriers can be set to provide more attenuation than for frequency bins $f_i$ corresponding to active subcarriers. The OFDM transmission processing includes an IFFT and OFDM receive processing includes an FFT. The IFFT and FFT have a given length M according to the particular protocol. When the frequency transform 702 applies an FFT of the same length as the OFDM format, the inactive subcarriers correspond to individual frequency bins in the same frequency locations in the baseband signal spectrum on a one-to-one basis. When the frequency transform 702 applies an FFT having a length N that is greater than M, one inactive subcarrier will correspond to multiple frequency bins. For example, if N=2M, each inactive subcarrier will correspond to 2 frequency bins resulting from the frequency transform 702. If N=M/2, one frequency bin will correspond to 2 inactive subcarriers. Since the lengths of FFTs are powers of 2, the ratio of subcarrier frequency width to frequency bin width will be a positive or negative power of 2.

For example, for the LTE protocol having the FFT length M=2048, the number of active subcarriers, Nasc, is 1200. Examples of initial compression control parameters are as follows. The frequency transform 702 applies an FFT of length N=2048 to generate 2048 complex coefficients, or 4096 real and imaginary components, where each real component and imaginary component has 16 bits, or nbits. For a desired compression ratio, CR, the target number of bits per coefficient, tbits=nbits/CR. The initial attenuation level $r_i$, in bits removed, for the frequency bins $f_i$ corresponding to inactive subcarriers is:

$$\tfrac{1}{3}*(nbits-tbits*(1-Nasc/N))=(bits\ removed) \quad (1)$$

For CR=2, tbits=8, and the initial attenuation level $r_i$ for the frequency bins indices $f_i$ corresponding to inactive subcarriers is:

$$\tfrac{1}{3}*(16-8*(1-1200/2048))=4.23(bits\ removed) \quad (2)$$

The attenuation level $r_i$ for the frequency bins $f_i$ corresponding to active subcarriers is set to 2 bits less than that of the inactive subcarriers, or 2.23 bits. This example corresponds the frequency domain attenuation profile of graph 714 in FIG. 9, where attenuation level $r_3$=2.23 bits for the frequency bin indices (−600 to +599) and attenuation level $r_4$=4.23 bits for the frequency bin indices (−1024 to −601) and (+600 to +1023).

For wireless communications in accordance with protocols for WiMAX and LTE, which are based on OFDM formats, guard times are used in the time domain and guard bands are used in the frequency domain to accommodate for the effects of a dispersive transmission channel. In an OFDM system, a guard time is inserted into the timing at the beginning of each OFDM symbol and then a copy of the end section of an IFFT packet is inserted at the beginning of the OFDM symbol. The inserted section is often called the cyclic prefix. A cyclic prefix is commonly used in OFDM systems to mitigate the effects of inter-symbol interference (ISI) and to preserve the orthogonality of the subcarriers. To completely remove ISI, the length of the cyclic prefix inserted into the packet is typically longer than the length of the dispersive channel. The locations of the guard bands are dependent upon the standard employed and are specified for both the LTE and WiMax protocols.

Figure 11:
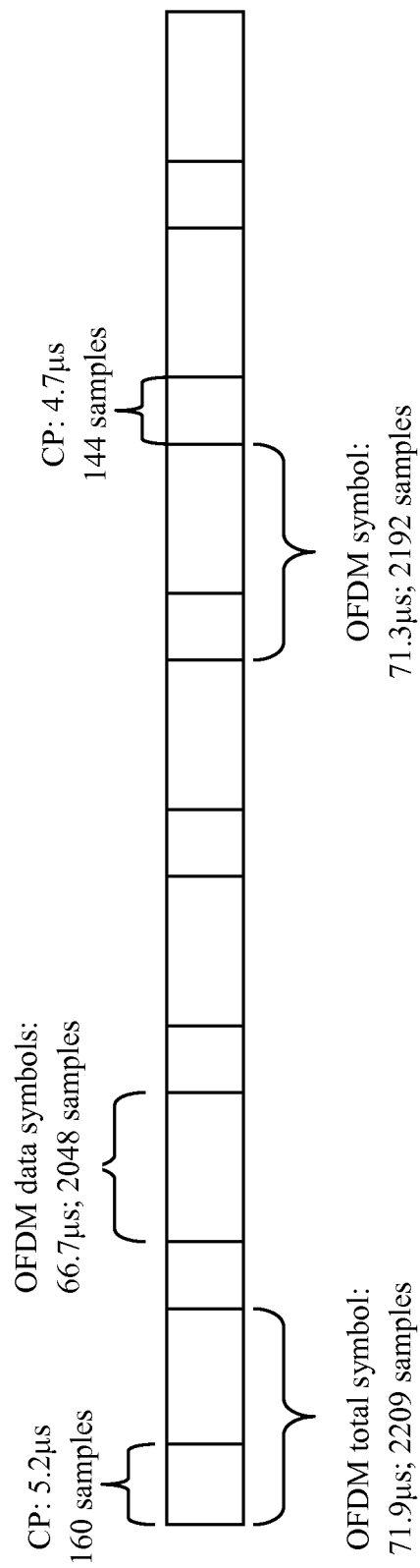
FIG. 11 illustrates the cyclic prefix of an LTE signal.

As shown with reference to FIG. 11, for LTE, the first symbol has a cyclic prefix equal to approximately 5.2 μs and the remaining symbols have a cyclic prefix equal to approximately 4.7 μs and the symbol length in LTE is set to 66.7 μs, with a carrier spacing of 15 kHz. The length of the cyclic prefix for the first symbol differs from that of the remaining symbol to create an overall length equal that is divisible by 15360. As shown in FIG. 11, the length of each OFDM symbol that contains useful data is equal to the total number of samples in the OFDM symbol, minus the number of samples in the cyclic prefix because the cyclic prefix is merely a copy of the data at the end of the OFDM symbol that has been appended to the beginning of the symbol to mitigate ISI. As such, in the case of an OFDM symbol having a length of 71.3 μs (2192 samples) and a cyclic prefix equal 4.7 μs (144 samples), the total useful OFDM symbol length is equal to 66.7 μs, or 2048 samples. Therefore, each of the OFDM symbols includes either 160 signal samples or 144 signal samples that do not contain useful data.

To achieve greater compression in OFDM transmission processing, the signal samples that lie within the cyclic prefix time can be removed prior to compressing the signal samples in the frequency domain. Removing the signal samples that do not contain useful data reduces the overall number of signal samples to be compressed. As such, removing the cyclic prefix signal samples prior to performing compression will increase the compression of the signal data prior to the transmission of the signal data over the serial data link. In the specific case of LTE, 160 signal samples can be removed from the first OFDM symbol and 144 signal samples can be removed from the remaining OFDM symbols prior to performing the frequency domain compression of the signals.

Figure 12:
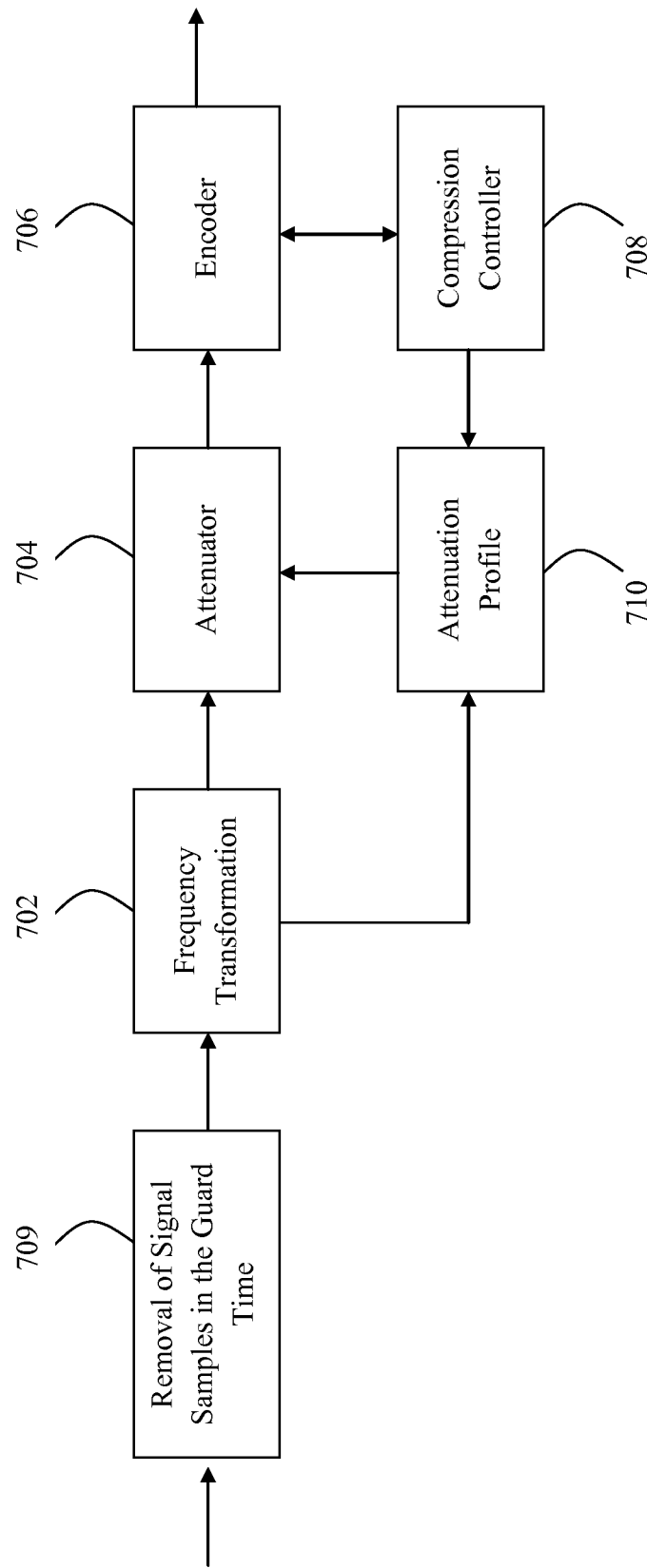
FIG. 12 is a block diagram of frequency domain compression with removal of a guard band, in accordance with a preferred embodiment.

With reference to FIG. 12, to achieve greater compression in OFDM transmission processing of signal samples comprising a guard time in the time domain having a cyclic prefix, the signal samples within the guard time can be removed 709 prior to the frequency transform 702 of the signal samples and therefore prior to the formation of the compressed coefficients by frequency domain attenuation 704 of the signal samples. Identifying and removing the signal samples within the guard time before compression allows the signal samples to be further compressed and reduces the volume of data transmitted over the serial data link.

Figure 10:
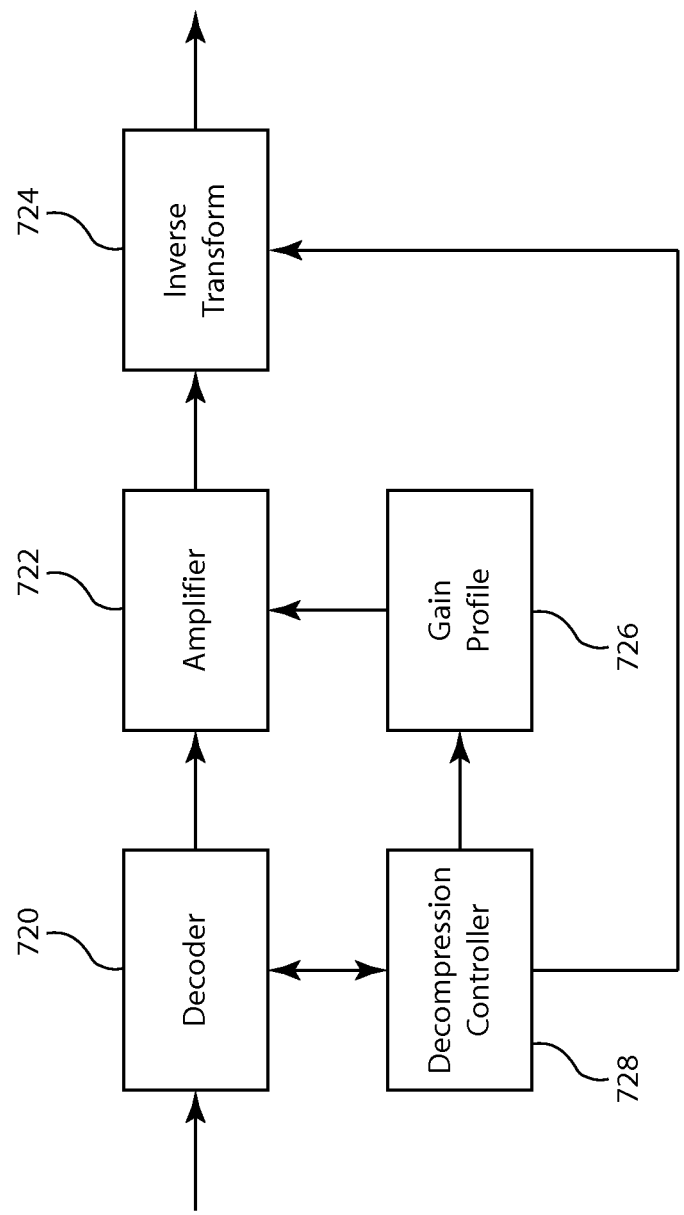
FIG. 10 is a block diagram of frequency domain decompression, in accordance with a preferred embodiment.

FIG. 10 is a block diagram of frequency domain decompression, in accordance with a preferred embodiment. The decompressors 125/125i and 135/135i apply the frequency domain decompression. The decoder 720 performs inverse operations of the encoder 706 to form reconstructed attenuated coefficients. For example, the decoder 720 performs block floating point decoding, Huffman decoding or other decoding to unpack the compressed coefficients. The amplifier 722 applies the gain profile 726 to the reconstructed attenuated samples to form the decompressed coefficients. The gain profile 726 approximately inverts the attenuation profile. The amplifier 722 does not restore the original coefficient values because the truncation or rounding that occurs from attenuation is irreversible. Since the gain profile does not provide the exact inverse of the attenuation profile, the resulting compression/decompression is lossy. However, the decompressed coefficients may have the same number of bits and the same dynamic range as the original frequency domain coefficients.

The amplifier 722 applies a gain profile 726 by multiplying the reconstructed attenuated coefficients by the corresponding gain levels. The gain levels for the gain profile 726 can be stored in a lookup table in memory and provided to the amplifier 722. Alternatively, the amplifier 722 can calculate the gain levels from parameters representing the gain profile 726. A simple embodiment of the amplifier 722 includes left shifting the reconstructed attenuated coefficient by a number of bits corresponding to the gain level and setting the additional least significant bits to zero or dithered values. The left shifts, corresponding to a multiplication by two, can reverse right shifts performed by the attenuator 704. The left shift values corresponding to the gain profile 726 can be stored in a lookup table or calculated by the amplifier 722 from parameters of the gain profile 726. When the gain level is not an integer, the fractional part of the gain can be applied by a multiplier.

The inverse transform 724 applies the inverse frequency domain transform to the decompressed coefficients and inverts the frequency transform 702. The inverse frequency domains transform is preferably an inverse discrete Fourier transform (IDFT) or inverse fast Fourier transform (IFFT). Alternative inverse transforms include the inverse discrete cosine transform (IDCT) and the inverse discrete sine transform (IDST). The inverse transform block 724 applies an inverse frequency domain transform having the same length N as applied by the frequency transform block 702.

The decompression controller 728 provides control parameters to the decoder 720, gain profile 726 and inverse transform 724. The decompression controller 728 can extract control data from the header of the compressed data packet to determine the control parameters. The decompression controller 728 can also use modulation type information to determine the appropriate decompression configuration. The modulation type information can be included in the header. For OBSAI the modulation type can be determined from the type field of the RP3 messages.

In addition to the compression methods previously described for base transceiver systems employing OFDM transmission, additional frequency domain compression of the signal prior to transfer over the CPRI data link and design simplification of the baseband unit may be realized through an architectural change implemented within a base transceiver system employing OFDM techniques such as currently used in WiMAX and LTE based communication networks.

Figure 14:
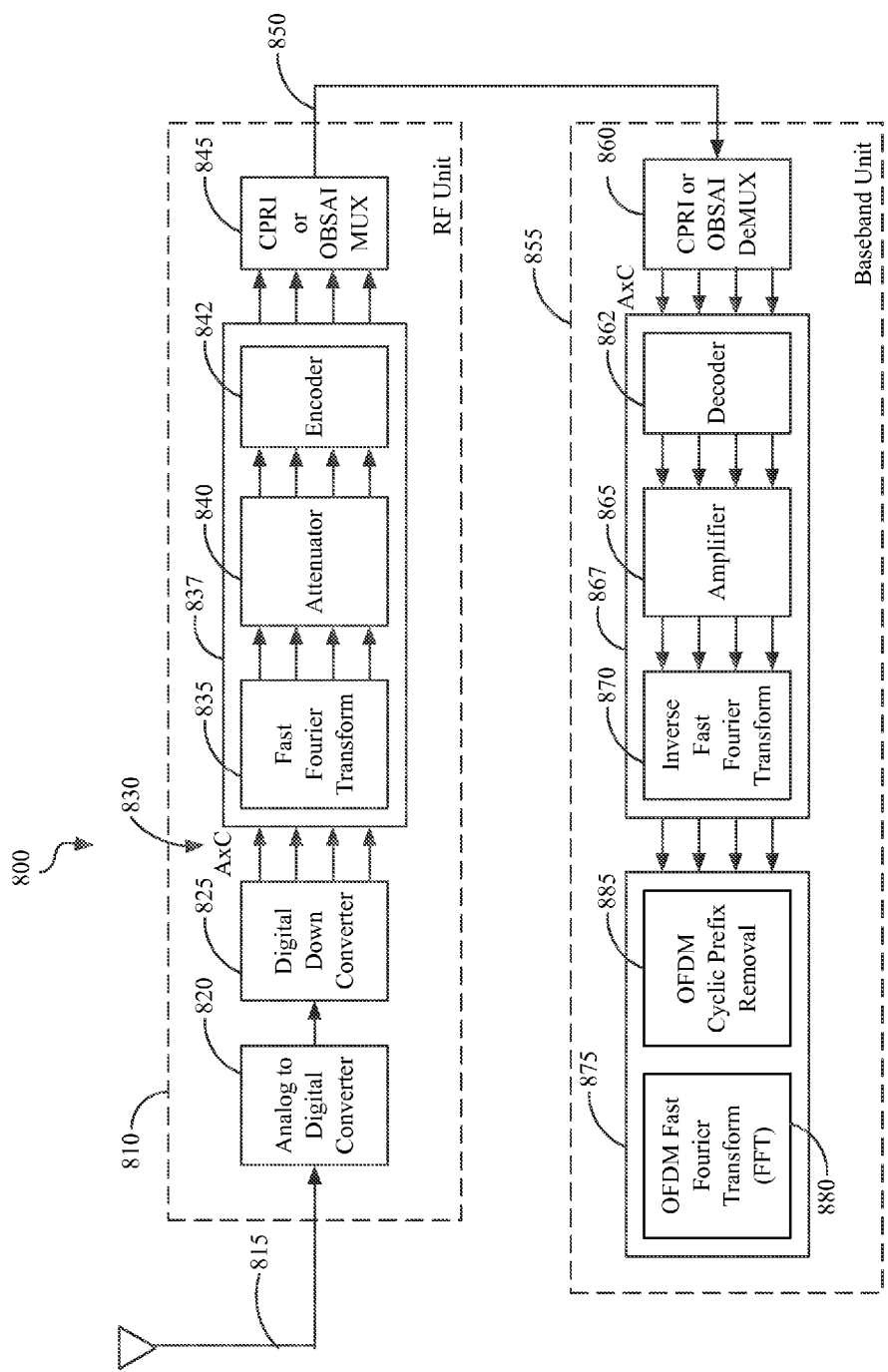
FIG. 14 is a block diagram of OFDM frequency domain compression performed in an RF unit and OFDM frequency domain decompression performed in a baseband unit of a base transceiver system, in accordance with a preferred embodiment.

With reference to FIG. 14, in a base transceiver system employing OFDM compression, as previously described, in the uplink mode, the RF unit 810 of the base transceiver system 800 may receive a serial stream of data 815 from a subscriber of the wireless network to be transmitted to a baseband unit 855 of the base transceiver system 800. The RF unit 810 may receive the serial data stream 815 from the subscriber, convert the serial data from analog to digital data 820 and processes the digital data through a digital down converter 825. The antenna carriers (AxC) 830 provided by the digital down converter 825 may then be provided to a frequency domain compressor 837 for further processing prior to transfer over the data link. As previously described, the frequency domain compressor 837 may include logic to compute a frequency domain transform 835 of a plurality of the signal samples of the corresponding baseband channel to form a plurality of frequency domain coefficients, wherein the frequency domain coefficients include a real component and an imaginary component for each of a plurality of frequency bins. A frequency transform, such as an (FFT) 835, may be used to calculate a frequency domain transform of the antenna carriers (AxC) 830 provided by the digital down converter 825 to form the frequency domain coefficients. The frequency transform is preferably a discrete Fourier transforms (DFT) or a fast Fourier Transform (FFT), which is a computationally efficient calculation of the DFT. Alternative transforms may include the discrete cosine transform (DCT) and the discrete sine transform (DST). The compressor 837 may further include an attenuator 840 to adjust the frequency domain coefficients in accordance with an attenuation profile to form a plurality of attenuated coefficients and an encoder 842 to encode the plurality of attenuated coefficients to provide a plurality of compressed coefficients, as previously described. The plurality of compressed coefficients provided by the compressor 837 may then be provided to the CPRI multiplexer 845 to produce a serial data stream for transmission over the CPRI data link 850.

After transmission over the CPRI data link 850, the serial data stream of compressed coefficients may be received at a baseband unit 855. The baseband unit 855 may receive the serial data stream and process the serial data stream through a CPRI demultiplexer to convert the serial data stream to a plurality of parallel antenna carriers (AxC) comprising the compressed coefficients. The compressed coefficients may then be provided to a frequency domain decompressor 867. The frequency domain decompressor 867 may include a decoder 862 to decode the compressed coefficients to provide a plurality of reconstructed attenuated coefficients and an amplifier 865 to increase the magnitude of the compressed coefficients in accordance with a gain profile to form decompressed coefficients corresponding to each baseband channel, wherein the gain profile corresponds to the attenuation profile used by the attenuator 840 of the RF unit 810. The decompressor may further include an inverse frequency domain transform unit 870 coupled to the amplifier 867, the inverse frequency domain transform unit 870 may compute an inverse frequency transform of the decompressed coefficients to generate decompressed signal samples of the corresponding baseband channel. The inverse frequency transform is preferably an inverse discrete Fourier transforms (IDFT) or an inverse fast Fourier Transform (IFFT), which is a computationally efficient calculation of the IDFT. Alternative transforms may include the inverse discrete cosine transform (IDCT) and the inverse discrete sine transform (IDST). The decompressed signal samples generated by the frequency domain decompressor 867 may then be provided to the baseband processor 875 for further OFDM baseband processing. The baseband processor 875 may include logic to remove the OFDM cyclic prefix 885 from the decompressed signal samples and an OFDM fast Fourier transform (FFT) 880 to demodulate the decompressed signal samples.

As shown in FIG. 14, the frequency domain compressor 837 of the present invention may include a fast Fourier Transform (FFT) 835 an encoder 842 and an attenuator 840 in the RF unit 810 to compress the OFDM signal prior to transmission over the CPRI link. The baseband unit 855 comprises a frequency domain decompressor 867 which may include a decoder 862, an amplifier 865 and an inverse fast Fourier Transform (IFFT) 870 to decompress the OFDM signal received over the CPRI link. Additionally, the baseband unit 855 comprises a baseband processor 875 which may include logic to remove the OFDM cyclic prefix 885 and an OFDM fast Fourier Transform (FFT) 880 to demodulate the decompressed signal samples. The baseband processor 875 is a common element of a baseband unit 855 that is used to apply signal processing operations to the signal samples for each baseband channel. As shown, in accordance with the present invention, in the uplink mode, the frequency domain compressor 837 in the RF unit 810 performs an FFT 835 to convert the signal into the frequency domain for compression, the frequency domain decompressor 867 in the baseband unit 855 performs an IFFT 870 to convert the signal back into the time domain after the decompression and the baseband processor 875 in the baseband unit 855 performs an FFT to demodulate the signal. With the current architecture, an FFT 835 in the RF unit 810 transforms the signals to the frequency domain, an IFFT 870 in the baseband unit 855 transforms the signals from the frequency to the time domain and then another FFT 880 in the baseband processor 875 of the baseband unit 855 transforms the signals back into the frequency domain. As such, the signals from the RF unit 810 arrive at the IFFT 870 in the frequency domain and the IFFT 870 of the baseband unit transforms the signals from the frequency domain into the time domain only to have the FFT 880 of the baseband processor 875 transform the signals back into the frequency domain. It is desirable to simplify the design of the base transceiver system by eliminating the logic required for unnecessary processing steps, such as transforming the signals into the frequency for compression and then transforming the signals from the frequency domain into the time domain for decompression, only to transform them back into the frequency domain.

To simplify the design of the base transceiver system 800 and to provide additional compression of the signal samples prior to transfer over the CPRI data link 850, an architectural change to the base transceiver system may be implemented in accordance with the present invention. In the present invention, the OFDM cyclic prefix removal 885 and the OFDM FFT 880 commonly performed in the baseband processor 875 of the baseband unit 855 are relocated to the RF unit.

Figure 15:
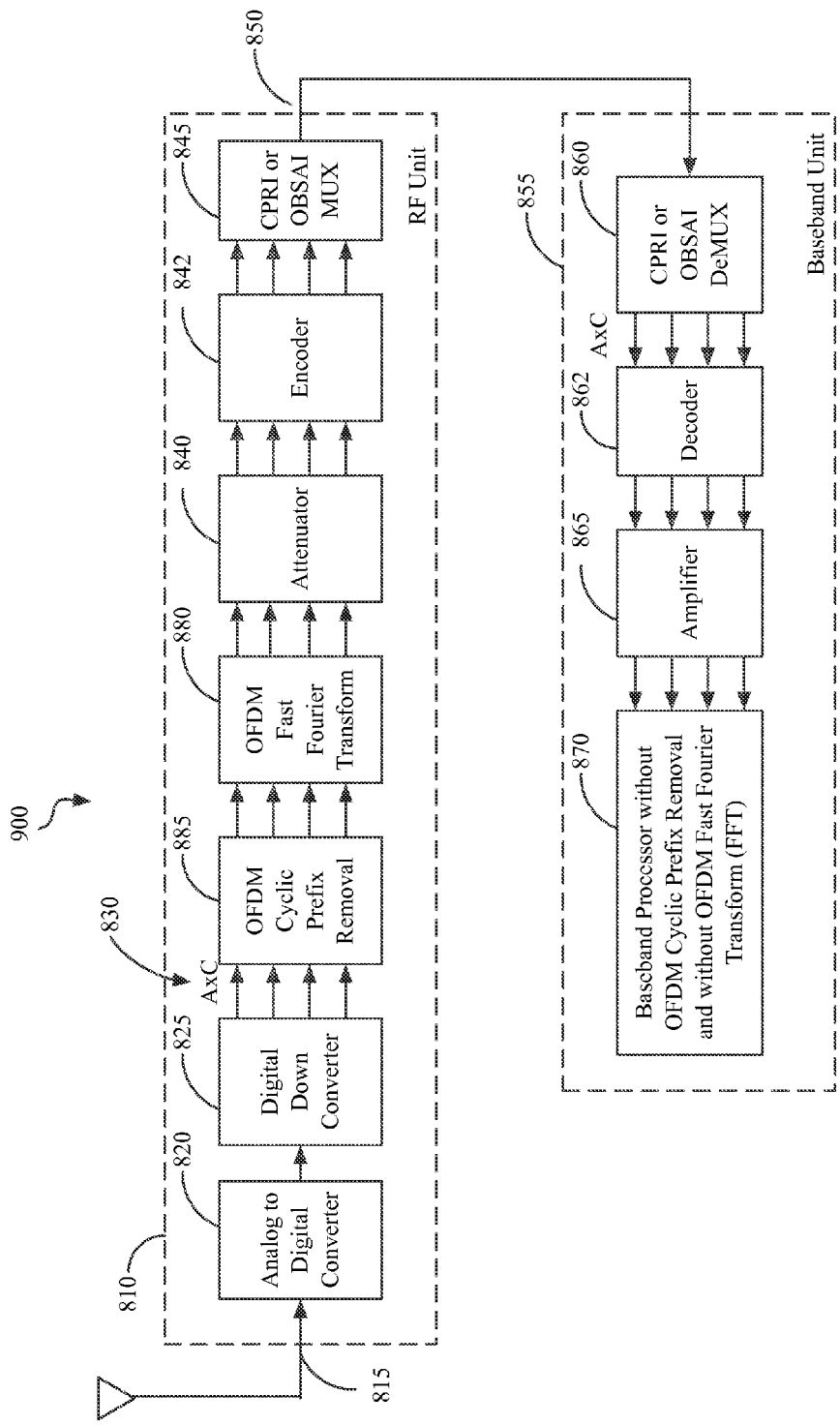
FIG. 15 is a block diagram of an improved architecture for performing OFDM frequency domain compression in an RF unit and OFDM frequency domain decompression in a baseband unit of base transceiver system, in accordance with a preferred embodiment.

With reference to FIG. 15, for a base transceiver system 900 employing OFDM compression technology and operating in the uplink mode, the RF unit 810 of the base transceiver system 800 may receive a serial stream of data 815 from a subscriber of the wireless network to be transmitted to a baseband unit 855 of the base transceiver system 900. The RF unit 810 may receive the serial data stream 815, convert the serial data from analog to digital data 820 and processes the digital data through a digital down converter 825. The antenna carriers (AxC) 830 generated by the digital down converter 825 may then be provided to an OFDM cyclic prefix removal circuit 885 for removal of the cyclic prefix from the antenna carriers (AxC). The antenna carriers, without the cyclic prefix, may then be transmitted to an OFDM FFT 880 to transform the signals into the frequency domain prior to being compressed by the attenuator 840. The FFT performed prior to the compression by the attenuator 840 is referred to as an OFDM FFT 880 because the size of the FFT is equal to the OFDM modulation length employed by the base transceiver system 900. The attenuated coefficients provided by the attenuator 840 may then be encoded by the encoder 842 to establish a plurality of compressed coefficients. The compressed coefficients may then be multiplexed by the CPRI multiplexer 845 and transmitted over the CPRI data link 850.

At the baseband unit 855, the compressed coefficients are demultiplexed by the CPRI demultiplexer 860, decoded by the decoder 862 to form reconstructed attenuated coefficients and amplified by the amplifier 865 to form decompressed coefficients. The decompressed coefficients are then provided to the baseband processor 870 for further signal processing of the decompressed coefficients. However, the baseband processor 870 in accordance with the present invention does not include logic to remove the OFDM cyclic prefix from the decompressed signal and does not include an FFT to transform the decompressed signal into the frequency domain because the cyclic prefix was previously removed in the RF unit and the decompressed signal was not transformed into the time domain after being amplified by the amplifier 865 as in the previous architectural design of the baseband unit.

As such, in accordance with the present invention, the OFDM cyclic prefix removal process and the OFDM FFT are moved from the baseband processor of the baseband unit 855 to the RF unit 810. This architectural change removes unnecessary processing steps in the base transceiver system 900, simplifies the design of the baseband unit 855 and provides additional compression by removing the cyclic prefix 885 prior to attenuating and encoding the signal 840 and before transmitting the compressed coefficients over the CPRI link 850.

Figure 16:
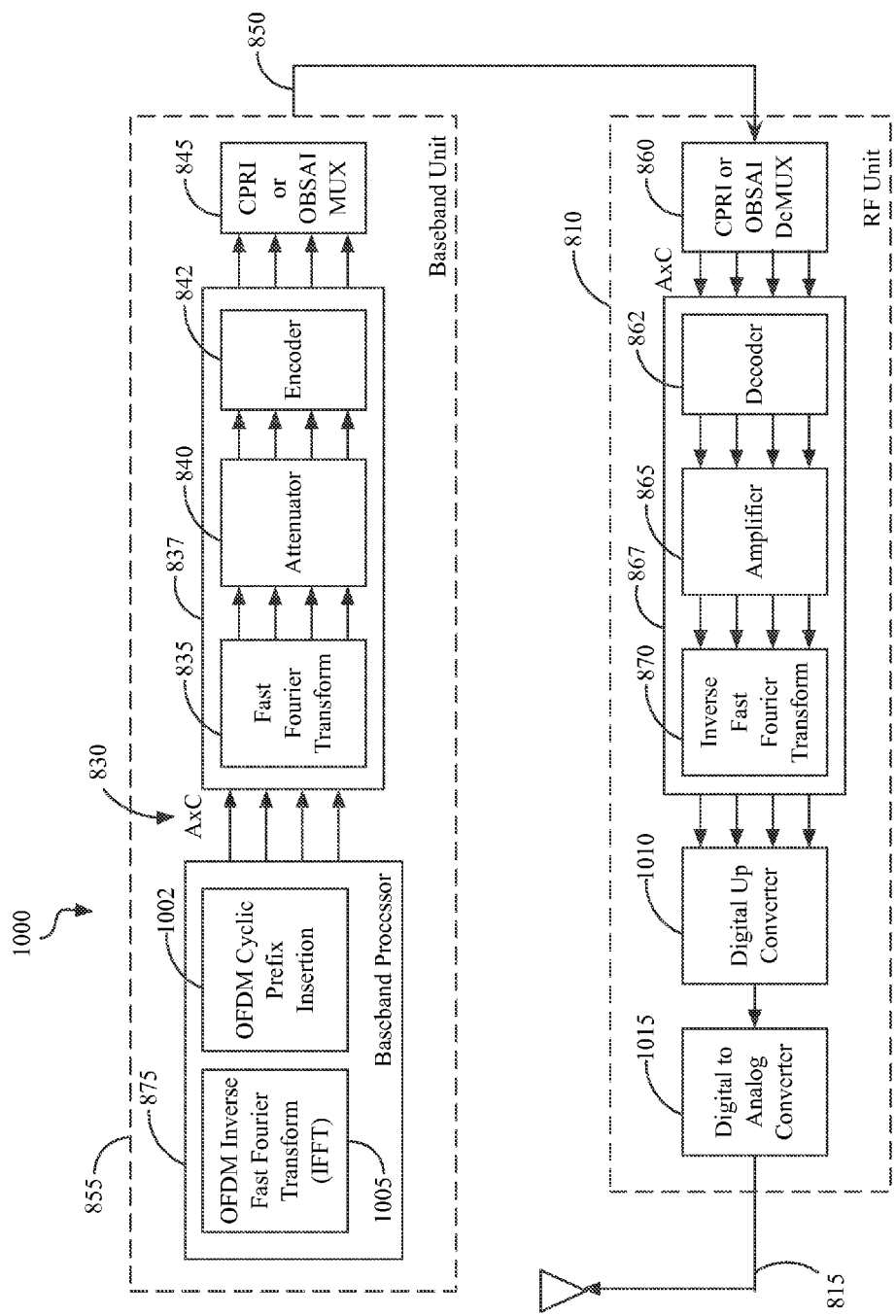
FIG. 16 is a block diagram of OFDM frequency domain compression performed in a baseband unit and OFDM frequency domain decompression performed in an RF unit of a base transceiver system, in accordance with a preferred embodiment.

With reference to FIG. 16, in a base transceiver system employing OFDM compression, as previously described, in the downlink mode, the baseband unit 855 may prepare data to be transmitted over the CPRI data link 850 to an RF unit 810 of the base transceiver system 1000. The RF unit 810 may receive the data from the baseband unit 855 and further process the data to transmit a serial stream of data 815 from the RF unit 810 to a subscriber of the wireless network. The baseband processor 875 of the baseband unit 855 may form a plurality of OFDM antenna carriers (AxC) 830 by modulating the serial data using an OFDM IFFT 1005 and inserting an OFDM cyclic prefix 1002 into the modulate signal streams. The antenna carriers (AxC) 830 provided by the baseband processor 875 may then be provided to a frequency domain compressor 837 for further processing, prior to transfer over the data link. As previously described, the frequency domain compressor 837 may include logic to compute a frequency domain transform 835 of a plurality of the signal samples of the corresponding baseband channel to form a plurality of frequency domain coefficients, wherein the frequency domain coefficients include a real component and an imaginary component for each of a plurality of frequency bins. A frequency transform, such as an (FFT) 835, may be used to calculate a frequency domain transform of the antenna carriers (AxC) 830 provided by the baseband processor 875 to form the frequency domain coefficients. The frequency transform is preferably a discrete Fourier transforms (DFT) or a fast Fourier Transform (FFT), which is a computationally efficient calculation of the DFT. Alternative transforms may include the discrete cosine transform (DCT) and the discrete sine transform (DST). The compressor 837 may further include an attenuator 840 to adjust the frequency domain coefficients in accordance with an attenuation profile to form a plurality of attenuated coefficients and an encoder 842 to encode the plurality of attenuated coefficients to provide a plurality of compressed coefficients, as previously described. The plurality of compressed coefficients provided by the compressor 837 may then be provided to the CPRI multiplexer 845 to produce a serial data stream for transmission over the CPRI data link 850.

After transmission over the CPRI data link 850, the serial data stream of compressed coefficients may be received at an RF unit 810. The RF unit 810 may receive the serial data stream and process the serial data stream through a CPRI demultiplexer to convert the serial data stream to a plurality of parallel antenna carriers (AxC) comprising the compressed coefficients. The compressed coefficients may then be provided to a frequency domain decompressor 867. The frequency domain decompressor 867 may include a decoder 862 to decode the compressed coefficients to provide a plurality of reconstructed attenuated coefficients and an amplifier 865 to increase the magnitude of the compressed coefficients in accordance with a gain profile to form decompressed coefficients corresponding to each baseband channel, wherein the gain profile corresponds to the attenuation profile used by the attenuator 840 of the RF unit 810. The decompressor may further include an inverse frequency domain transform unit 870 coupled to the amplifier 867, the inverse frequency domain transform unit 870 may compute an inverse frequency transform of the decompressed coefficients to generate decompressed signal samples of the corresponding baseband channel. The inverse frequency transform is preferably an inverse discrete Fourier transforms (IDFT) or an inverse fast Fourier Transform (IFFT), which is a computationally efficient calculation of the IDFT. Alternative transforms may include the inverse discrete cosine transform (IDCT) and the inverse discrete sine transform (IDST). The decompressed signal samples generated by the frequency domain decompressor 867 may then be processed through a digital up converter 1010 and a digital to analog converter 1015 to provide a serial data stream 815 for transmission to a subscriber of the wireless network.

As shown in FIG. 16, the frequency domain compressor 837 of the present invention may include a fast Fourier Transform (FFT) 835 an encoder 842 and an attenuator 840 in the baseband unit 855 to compress the OFDM signal prior to transmission over the CPRI link. The RF unit 810 comprises a frequency domain decompressor 867 which may include a decoder 862, an amplifier 865 and an inverse fast Fourier Transform (IFFT) 870 to decompress the OFDM signal received over the CPRI link. Additionally, the baseband unit 855 comprises a baseband processor 875 which may include logic to insert an OFDM cyclic prefix 1002 and an OFDM inverse fast Fourier Transform (IFFT) 1005 to modulate the signal samples. The baseband processor 875 is a common element of a baseband unit 855 that is used to apply signal processing operations to the signal samples for each baseband channel. As shown, in accordance with the present invention, in the downlink mode, the baseband processor 875 in the baseband unit 855 performs an IFFT 1005 to modulate the signal, the frequency domain compressor 837 in the baseband unit 855 performs an FFT 835 to transform the signal into the frequency domain prior to compression and the frequency domain decompressor 867 in the RF unit 810 performs an IFFT to transform the signals back into the time domain after decompression. With the current architecture, an IFFT 1005 in the baseband processor 875 of the baseband unit 855 transforms the signals from the frequency domain into the time domain, an FFT 835 in the baseband unit 855 transforms the signals from the time domain to the frequency domain and then another IFFT 870 in the RF unit 810 transforms the signals back into the time domain. As such, the signals are transformed from the frequency domain into the time domain by the IFFT 1005 of the baseband processor 875 of the baseband unit 855 only to have the FFT 835 of the compressor 837 in the baseband unit transform the signals back into the frequency domain for compression and transmission over the CPRI link 850. It is desirable to simplify the design of the base transceiver system by eliminating the logic required for unnecessary processing steps, such as transforming the signals from the frequency domain into the time domain only to transform them back into frequency domain for compression and transmission over the CPRI link.

To simplify the design of the base transceiver system 1000 and to provide additional compression of the signal samples prior to transfer over the CPRI data link 850, an architectural change to the base transceiver system may be implemented in accordance with the present invention. In the present invention, the OFDM cyclic prefix insertion 1002 and the OFDM IFFT 1005 commonly performed in the baseband processor 875 of the baseband unit 855 are relocated to the RF unit 810.

Figure 17:
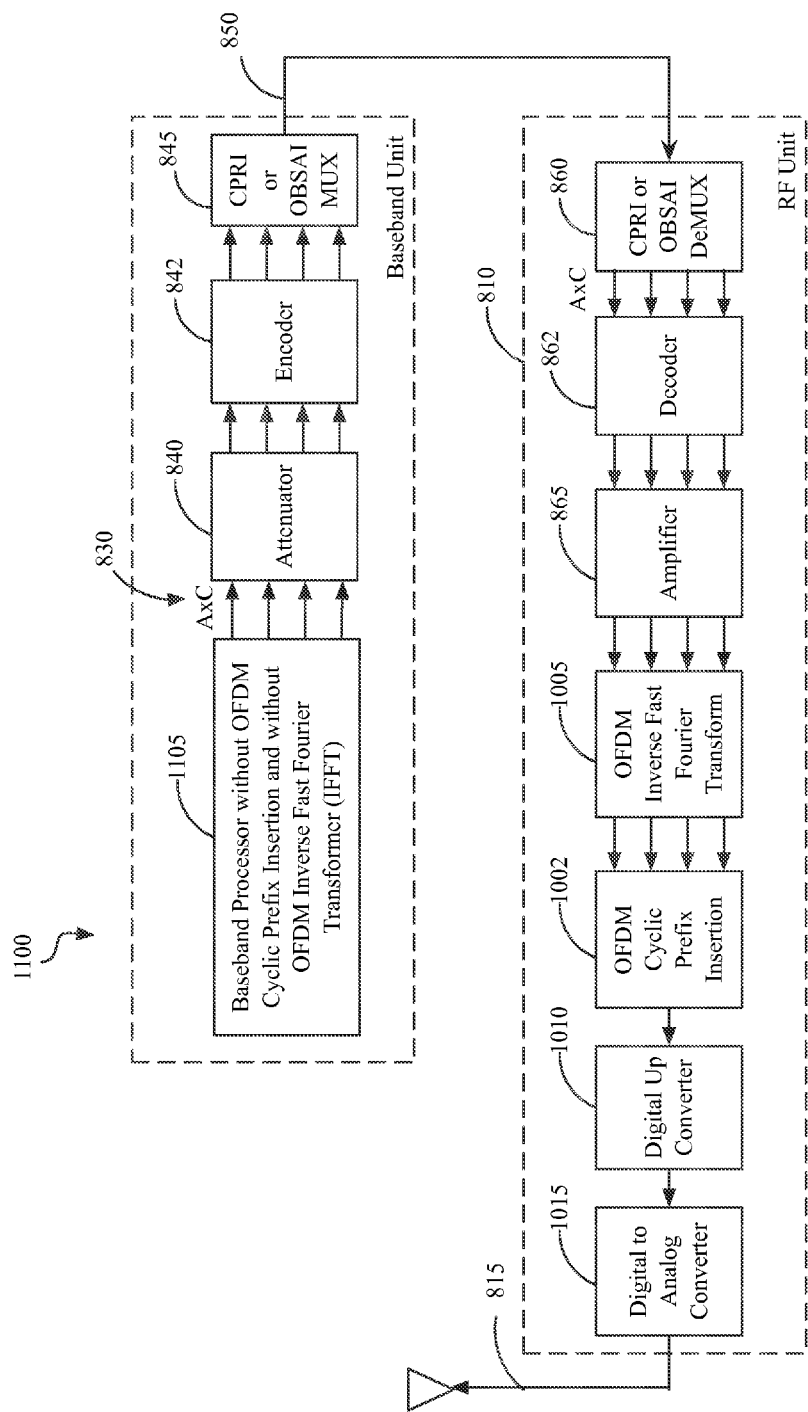
FIG. 17 is a block diagram of an improved architecture for performing OFDM frequency domain compression in a baseband unit and OFDM frequency domain decompression in an RF unit of a base transceiver system, in accordance with a preferred embodiment.

With reference to FIG. 17, for a base transceiver system 1100 employing OFDM compression technology and operating in the downlink mode, the baseband unit 855 of the base transceiver system 1100 may prepare data to be transmitted over the CPRI data link 850 to an RF unit 810 of the base transceiver system 1100. The RF unit 810 may receive the data from the baseband unit 855 and further process the data to transmit a serial stream of data 815 from the RF unit 810 to a subscriber of the wireless network. The baseband processor 1105 of the baseband unit 855 may include logic to apply signal processing operations, however in the present invention, the baseband processor 1105 of the baseband unit 855 does not include logic to form a plurality of OFDM antenna carriers (AxC) 830 by modulating the serial data using an OFDM IFFT and inserting an OFDM cyclic prefix into the modulate signal streams. This logic has been moved to the RF unit 810. In this embodiment, the FFT in the compressor of the baseband unit 855 is no longer necessary because the OFDM symbols are already mapped directly to the frequency domain by the modulator of the communication network and the symbols have not been transformed into the time domain by the baseband processor. The frequency domain symbols may then be compressed by the attenuator 840. The attenuated coefficients provided by the attenuator 840 may then be encoded by the encoder 842 to establish a plurality of compressed coefficients. The compressed coefficients may then be multiplexed by the CPRI multiplexer 845 and transmitted over the CPRI data link 850.

At the RF unit 810, the compressed coefficients are demultiplexed by the CPRI demultiplexer 860, decoded by the decoder 862 to form reconstructed attenuated coefficients and amplified by the amplifier 865 to form decompressed coefficients. The decompressed coefficients may be provided to an OFDM IFFT 1005 to modulate the data and an OFDM cyclic prefix 1002 may then be inserted into the modulated signal streams. The signal may then be processed through a digital up converter 1010 and a digital to analog converter 1015 prior to transmission of the serial signal 815 to the subscriber. The OFDM IFFT 1005 performed after the decompression by the amplifier 865 is referred to as an OFDM IFFT 1005 because the size of the IFFT is equal to the OFDM modulation length employed by the base transceiver system 1100.

As such, in accordance with the present invention, the OFDM cyclic prefix insertion process and the OFDM IFFT are moved from the baseband processor of the baseband unit 855 to the RF unit 810. This architectural change removes unnecessary processing steps in the base transceiver system 1100, simplifies the design of the baseband unit 855 and provides additional compression by not inserting the cyclic prefix prior to attenuating and encoding the signal and before transmitting the compressed coefficients over the CPRI link 850.

The compression methods described above can be configured to produce lossy compression based on a desired output bit rate or a desired quality metric. Depending on system parameters, it can be possible to obtain the specified bit error rates (BER), or other quality metric, for data transfer when lossy compression is applied to the signal samples. Lossy compression can provide additional resource savings within the BER limitation.

In the examples of FIGS. 1 through 4, and 14 through 17, the BTS includes compression and decompression on both the forward link from the base station processor to the RF unit and the reverse link from the RF unit to the base station processor. Alternative embodiments include providing compression and decompression in one direction only. For the forward link, or down link, only the base station processor may include a compressor and only the RF unit includes a decompressor. For the reverse link, or up link, only the RF unit may include a compressor and only the base station processor includes a decompressor.

Implementation alternatives for the compressor and decompressor include programmable processors and application specific integrated circuits (ASIC). The programmable processors include software/firmware programmable processors such as computers, digital signal processors (DSP), microprocessors (including microcontrollers) and other programmable devices, and hardware programmable devices such as complex programmable logic devices (CPLD), field programmable gate arrays (FPGA). Depending on the type of programmable processor, the program implementing the compression and decompression operations are represented by software, firmware, netlist, bitstream or other type of processor executable instructions and data. Subsystems that implement the compressor and decompressor can be integrated into devices that perform other functions of the RF unit or base station processor. Implementations of compression or decompression can be performed in real time, that is, at least as fast as the sample rate of the ADC or DAC. Compression and decompression operations include multiplexing operations, inversion operations and simple arithmetic operations including addition, subtraction and shifting.

In one embodiment, compression and decompression logic may be implemented on a single integrated circuit. In an additional embodiment, compression and decompression logic may be implemented on separate integrated circuits While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

I claim:

1. In a base transceiver system of a wireless communication network, a method for transferring OFDM modulated signal data from a radio frequency (RF) unit to a baseband unit over a serial data link, wherein the RF unit is connected to an antenna to receive an analog signal, the analog signal representing a plurality of antenna-carrier channels, the RF unit including an analog to digital converter (ADC) that converts the analog signal to a digital signal and a digital down converter (DDC) that downconverts the digital signal to a plurality of baseband channels, each baseband channel corresponding to one of the antenna-carrier channels and having a sequence of signal samples, wherein each signal sample includes an in-phase (I) sample and a quadrature (Q) sample, wherein a baseband processor of the baseband unit performs signal processing operations, the method comprising:

compressing the sequence of signal samples of each baseband channel at the RF unit, wherein for each baseband channel the compressing comprises:

computing an OFDM frequency domain transform of a plurality of the sequence of signal samples of each baseband channel at the RF unit to form a plurality of frequency domain coefficients, wherein the frequency domain coefficients include a real component and an imaginary component for each of a plurality of frequency bins and wherein a length of the OFDM frequency domain transform is equal to a symbol length of the OFDM modulated signal data;

attenuating one or more of the frequency domain coefficients in accordance with an attenuation profile to form a plurality of attenuated coefficients, wherein the attenuation profile specifies attenuation levels corresponding to the frequency bins; and
encoding the attenuated coefficients to form compressed coefficients;
formatting the compressed coefficients of the plurality of baseband channels for transfer over the serial data link;
transferring the compressed coefficients over the serial data link from the RF unit to the baseband unit;
receiving the compressed coefficients at the baseband unit; and
decompressing the compressed coefficients at the baseband unit, wherein for each baseband channel the decompressing comprises:
decoding the compressed coefficients to form reconstructed attenuated coefficients;
amplifying a plurality of the reconstructed attenuated coefficients in accordance with a gain profile to form a plurality of decompressed coefficients corresponding to each baseband channel, wherein the gain profile corresponds to the attenuation profile and specifies gain levels for corresponding frequency bins; and
providing the decompressed coefficients to the baseband processor of the baseband unit to apply the signal processing operations to the decompressed coefficients.

2. The method of claim 1, wherein computing an OFDM frequency domain transform further comprises computing an OFDM frequency domain transform using a discrete Fourier transform (DFT), a fast Fourier transform (FFT), a discrete cosine transform (DCT), or a discrete sine transform (DST).

3. The method of claim 1, wherein formatting the compressed coefficients, transferring the compressed coefficients and receiving the compressed coefficients are performed in accordance with an Open Base Station Architecture Initiative (OBSAI) standard or in accordance with a Common Public Radio Interface (CPRI) standard.

4. The method of claim 1, wherein formatting the compressed coefficients further comprises:
mapping a sequence of the compressed coefficients corresponding to each baseband channel to a sequence of data structures to form a plurality of sequences of data structures for the plurality of baseband channels; and
multiplexing the plurality of sequences of data structures corresponding to the plurality of baseband channels to form a sequence of multiplexed data structures containing the compressed coefficients prior to transferring the compressed coefficients.

5. The method of claim 4, wherein the data structures are formed in accordance with an Open Base Station Architecture Initiative (OBSAI) standard using a Reference Point 3 (RP3) message protocol or with a Common Public Radio Interface (CPRI) standard using an antenna-carrier (AxC) container protocol.

6. The method of claim 1, wherein the compressing further comprises, removing an OFDM cyclic prefix from the plurality of the signal samples of each baseband channel at the RF unit prior to computing an OFDM frequency domain transform of a plurality of the signal samples of each baseband channel at the RF unit.

7. In a base transceiver system of a wireless communication network, a method for transferring OFDM modulated signal data from a baseband unit to a radio frequency (RF) unit over a serial data link, each signal sample associated with one of a plurality of baseband channels, wherein each signal sample includes an in-phase (I) sample and a quadrature (Q) sample, the RF unit including a digital up converter (DUC) that upconverts a sequence of signal samples of each baseband channel to a corresponding one of a plurality of antenna-carrier channels to form a single upconverted digital signal and a digital to analog converter (DAC) that converts the upconverted digital signal to an analog signal, wherein the RF unit is coupled to an antenna to transmit the analog signal, the analog signal representing the plurality of antenna-carrier channels, the method comprising:
receiving a plurality of frequency domain coefficients for a plurality of baseband channels of the OFDM modulated signal data at the baseband unit, wherein the frequency domain coefficients include a real component and an imaginary component for each of a plurality of frequency bins;
compressing the frequency domain coefficients of each baseband channel at the baseband unit, wherein for each baseband channel the compressing comprises:
attenuating one or more of the frequency domain coefficients in accordance with an attenuation profile to form a plurality of attenuated coefficients, wherein the attenuation profile specifies attenuation levels corresponding to the frequency bins; and
encoding the attenuated coefficients to form compressed coefficients; the method further comprising:
formatting the compressed coefficients of the plurality of baseband channels for transfer over the serial data link;
transferring the compressed coefficients over the serial data link from the baseband unit to the RF unit;
receiving the compressed coefficients at the RF unit; and
decompressing the compressed coefficients at the RF unit, wherein for each baseband channel the decompressing comprises:
decoding the compressed coefficients to form reconstructed attenuated coefficients;
amplifying a plurality of the reconstructed attenuated coefficients in accordance with a gain profile to form a plurality of decompressed coefficients corresponding to each baseband channel, wherein the gain profile corresponds to the attenuation profile and specifies gain levels for corresponding frequency bins;
computing an OFDM inverse frequency domain transform of the plurality of decompressed coefficients to form a plurality of decompressed signal samples of the corresponding baseband channel, wherein each decompressed signal sample includes a decompressed I sample and a decompressed Q sample, wherein a length of the OFDM inverse frequency domain transform is equal to a symbol length of the OFDM signal data; and
providing the decompressed signal samples to the DUC for forming the upconverted digital signal.

8. The method of claim 7, wherein the OFDM inverse frequency domain transform comprises an inverse frequency domain transform using a discrete Fourier transform (DFT), a fast Fourier transform (FFT), discrete cosine transform (DCT), or a discrete sine transform (DST).

9. The method of claim 7, wherein formatting the compressed coefficients, transferring the compressed coefficients and receiving the compressed coefficients are performed in accordance with an Open Base Station Architecture Initiative (OBSAI) standard or in accordance with a Common Public Radio Interface (CPRI) standard.

10. The method of claim 7, wherein formatting the compressed coefficients further comprises:
mapping a sequence of the compressed coefficients corresponding to each baseband channel to a sequence of data structures, to form a plurality of sequences of data structures for the plurality of baseband channels; and multiplexing the plurality of sequences of data structures corresponding to the plurality of baseband channels to form a sequence of multiplexed data structures containing the compressed coefficients for the step of transferring.

11. The method of claim 10, wherein the data structures are formed in accordance with an Open Base Station Architecture Initiative (OBSAI) standard using a Reference Point 3 (RP3) message protocol or a Common Public Radio Interface (CPRI) standard using an antenna-carrier (AxC) container protocol.

12. The method of claim 7, wherein the decompressing further comprises, inserting an OFDM cyclic prefix into the plurality of decompressed signal samples of each baseband channel at the RF unit after computing an OFDM inverse frequency domain transform of the plurality of decompressed coefficients to form a plurality of decompressed signal samples of the corresponding baseband channel at the RF unit.

13. The method of claim 7, wherein the decompressing further comprises, inserting an OFDM cyclic prefix into the sequence of decompressed signal samples prior to providing the decompressed signal samples to the DUC for forming the upconverted digital signal.

14. In a base transceiver system of an OFDM wireless communication network, including a radio frequency (RF) unit coupled to an antenna to receive an analog signal and a baseband unit coupled to the RF unit by a serial data link, the analog signal representing a plurality of antenna-carrier channels, the RF unit including an analog to digital converter (ADC) that converts the analog signal to a digital signal and a digital down converter (DDC) that downconverts the digital signal to a plurality of baseband channels, each baseband channel corresponding to one of the antenna-carrier channels and having a sequence of signal samples, wherein each signal sample includes an in-phase (I) sample and a quadrature (Q) sample, wherein a baseband processor of the baseband unit performs signal processing operations, an apparatus for data transfer from the RF unit to the baseband unit over the serial data link, the apparatus comprising:
 a plurality of compressors at the RF unit, each compressor coupled to receive the sequence of signal samples of a corresponding baseband channel output from the DDC, each of the plurality of compressors comprising:
  logic to compute an OFDM frequency domain transform of a plurality of the sequence of signal samples of the corresponding baseband channel to form a plurality of frequency domain coefficients, wherein the frequency domain coefficients include a real component and an imaginary component for each of a plurality of frequency bins, wherein a length of the OFDM frequency domain transform is equal to a symbol length of the OFDM signal data;
  an attenuator to adjust the frequency domain coefficients in accordance with an attenuation profile to form a plurality of attenuated coefficients, wherein the attenuation profile specifies attenuation levels corresponding to the frequency bins, wherein the attenuation profile is stored in a first memory coupled to the attenuator; and
  an encoder coupled to the attenuator to encode the attenuated coefficients to form compressed coefficients;
 a formatter coupled to the plurality of compressors to format the compressed coefficients of the plurality of baseband channels in accordance with a data transfer protocol;
 the serial data link coupled to the formatter for transferring the compressed coefficients to the baseband processor;
 the baseband unit coupled to the serial data link to receive the compressed coefficients; and
 a plurality of decompressors at the baseband unit, each decompressor receiving the compressed coefficients of the corresponding baseband channel, each of the plurality of decompressors comprising:
  a decoder to decode the compressed coefficients to form reconstructed attenuated coefficients;
  an amplifier coupled to the decoder to increase magnitudes of a plurality of the reconstructed attenuated coefficients in accordance with a gain profile to form a plurality of decompressed coefficients, wherein the gain profile corresponds to the attenuation profile and specifies gain levels corresponding to the frequency bins, wherein the gain profile is stored in a second memory coupled to the amplifier; and
 a baseband processor of the baseband unit to apply the signal processing operations to the decompressed coefficients for each baseband channel.

15. The apparatus of claim 14, wherein the logic to compute the OFDM frequency domain transform comprises a discrete Fourier transform (DFT), a fast Fourier transform (FFT), a discrete cosine transform (DCT) or a discrete sine transform (DST).

16. The apparatus of claim 14, wherein the compressor is implemented in a programmable processor, a field programmable gate array (FPGA) or an application specific integrated circuit (ASIC) at the RF unit.

17. The apparatus of claim 14, wherein the data transfer protocol is compatible with an Open Base Station Architecture Initiative (OBSAI) standard or a Common Public Radio Interface (CPRI) standard.

18. The apparatus of claim 14, wherein the formatter further comprises:
 a plurality of mappers, each mapper receiving a sequence of the compressed coefficients from a corresponding compressor and mapping the sequence of the compressed coefficients to a sequence of data structures, the plurality of mappers producing a plurality of sequences of data structures corresponding to the plurality of baseband channels; and
 a multiplexer that combines the plurality of sequences of data structures to form a sequence of multiplexed data structures representing the compressed coefficients of the plurality of baseband channels, wherein the multiplexer provides the sequence of multiplexed data structures to the serial data link.

19. The apparatus of claim 18, wherein the data structures are formed in accordance with an Open Base Station Architecture Initiative (OBSAI) standard using a Reference Point 3 (RP3) message protocol or a Common Public Radio Interface (CPRI) standard using an antenna-carrier (AxC) container protocol.

20. The apparatus of claim 14, wherein the decompressor is implemented in a field programmable gate array (FPGA), an application specific integrated circuit (ASIC) or a programmable processor of the baseband processor.

21. The apparatus of claim 14, wherein the baseband unit further comprises:
 a demultiplexer that receives the sequence of multiplexed data structures representing the compressed coefficients and reconstructs the plurality of sequences of data structures corresponding to the plurality of baseband channels; and a plurality of demappers, each demapper receiving a corresponding sequence of data structures from the demultiplexer and extracting the sequence of the compressed coefficients of the corresponding baseband channel, wherein the plurality of demappers provides the plurality of sequences of the compressed coefficients to the plurality of decompressors.

22. The apparatus of claim 14, wherein each of the plurality of compressors further comprises, logic coupled to the output of the DDC to remove an OFDM cyclic prefix from the plurality of signal samples.

23. In a base transceiver system of an OFDM wireless communication network, including a radio frequency (RF) unit coupled to an antenna to transmit an analog signal and a baseband unit coupled to the RF unit by a serial data link, the baseband unit providing a plurality of signal samples to the RF unit, each signal sample associated with one of a plurality of baseband channels, wherein each signal sample includes an in-phase (I) sample and a quadrature (Q) sample, the RF unit including a digital up converter (DUC) that upconverts a sequence of signal samples of each baseband channel to a corresponding one of a plurality of antenna-carrier channels to form a single upconverted digital signal and a digital to analog converter (DAC) that converts the upconverted digital signal to the analog signal, the analog signal representing the plurality of antenna-carrier channels, an apparatus for data transfer from the baseband unit to the RF unit, the apparatus comprising:
 a plurality of compressors at the baseband unit, each compressor for receiving frequency domain coefficients for a plurality of baseband channels of the OFDM modulated signal data, wherein the frequency domain coefficients include a real component and an imaginary component for each of a plurality of frequency bins and for compressing frequency domain coefficients of a corresponding baseband channel, each of the plurality of compressors comprising:
  an attenuator to adjust the frequency domain coefficients in accordance with an attenuation profile to form a plurality of attenuated coefficients, wherein the attenuation profile specifies attenuation levels corresponding to the frequency bins, wherein the attenuation profile is stored in a first memory coupled to the attenuator; and
  an encoder coupled to the attenuator to encode the attenuated coefficients to form compressed coefficients;
 a formatter coupled to the plurality of compressors to format the compressed coefficients in accordance with a data transfer protocol;
 the serial data link coupled to the formatter for transferring the compressed coefficients to the RF unit;
 the RF unit coupled to the serial data link to receive the compressed coefficients; and
 a plurality of decompressors at the RF unit, each decompressor receiving the compressed coefficients of the corresponding baseband channel, each of the plurality of decompressors comprising:
  a decoder to decode the compressed coefficients to form reconstructed attenuated coefficients;
  an amplifier coupled to the decoder to increase magnitudes of a plurality of the reconstructed attenuated coefficients in accordance with a gain profile to form a plurality of decompressed coefficients, wherein the gain profile corresponds to the attenuation profile and specifies gain levels corresponding to the frequency bins, wherein the gain profile is stored in a second memory coupled to the amplifier; and
  logic coupled to the amplifier to compute an OFDM inverse frequency domain transform of the plurality of decompressed coefficients to form a plurality of decompressed signal samples of the corresponding baseband channel, wherein each decompressed signal sample includes a decompressed I sample and a decompressed Q sample, wherein a length of the OFDM frequency domain transform is equal to a symbol length of the OFDM signal data and wherein the decompressed signal samples are provided to the DUC for forming the upconverted digital signal.

24. The apparatus of claim 23, wherein the logic to compute the OFDM inverse frequency domain transform comprises an inverse frequency domain transform using a discrete inverse Fourier transform (IDFT), a inverse fast Fourier transform (IFFT), a discrete cosine transform (DCT) or a discrete sine transform (DST).

25. The apparatus of claim 23, wherein the compressor is implemented in a programmable processor, a field programmable gate array (FPGA) or an application specific integrated circuit (ASIC) of the baseband processor.

26. The apparatus of claim 23, wherein the data transfer protocol is compatible with an Open Base Station Architecture Initiative (OBSAI) standard or a Common Public Radio Interface (CPRI) standard.

27. The apparatus of claim 23, wherein the formatter further comprises:
 a plurality of mappers, each mapper receiving a sequence of the compressed coefficients from a corresponding compressor and mapping the sequence of the compressed coefficients to a sequence of data structures, the plurality of mappers producing a plurality of sequences of data structures corresponding to the plurality of baseband channels; and
 a multiplexer that combines the plurality of sequences of data structures to form a sequence of multiplexed data structures representing the compressed coefficients of the plurality of baseband channels, wherein the multiplexer provides the sequence of multiplexed data structures to the serial data link.

28. The apparatus of claim 27, wherein the data structures are formed in accordance with an Open Base Station Architecture Initiative (OBSAI) standard using a Reference Point 3 (RP3) message protocol or a Common Public Radio Interface (CPRI) standard using an antenna-carrier (AxC) container protocol.

29. The apparatus of claim 23, wherein the decompressor is implemented in a field programmable gate array (FPGA), an application specific integrated circuit (ASIC) or a programmable processor at the RF unit.

30. The apparatus of claim 23, wherein the RF unit further comprises:
 a demultiplexer that receives the sequence of multiplexed data structures representing the compressed coefficients and reconstructs the plurality of sequences of data structures corresponding to the plurality of baseband channels; and
 a plurality of demappers, each demapper receiving a corresponding sequence of data structures from the demultiplexer and extracting the sequence of the compressed coefficients of the corresponding baseband channel, wherein the plurality of demappers provides the plurality of sequences of the compressed coefficients to the plurality of decompressors.

31. The apparatus of claim 23, wherein each of the plurality of decompressors further comprises, logic coupled to the OFDM inverse frequency domain transform to insert an OFDM cyclic prefix into the plurality of decompressed signal samples.

32. An integrated circuit device for compressing OFDM signal data for transmission over a serial data link in a base transceiver system of a wireless communication network, the integrated circuit device comprising:
   logic to remove an OFDM cyclic prefix from a plurality of signal samples of the OFDM signal data;
   an OFDM frequency transform unit to compute an OFDM frequency domain transform of the plurality of signal samples to generate a plurality of frequency domain coefficients for each of a plurality of frequency bins, wherein a length of the OFDM frequency domain transform is equal to a symbol length of the OFDM signal data;
   an attenuator coupled to the frequency transform unit, the attenuator to adjust the plurality of frequency domain coefficients in accordance with an attenuation profile to generate a plurality of attenuated coefficients, wherein the attenuation profile specifies attenuation levels corresponding to the plurality of frequency bins; and
   an encoder coupled to the attenuator, the encoder to encode the attenuated coefficients to form a plurality of compressed coefficients for transmission over the serial data link.

33. The integrated circuit device of claim 32, wherein the base transceiver system comprises at least one radio frequency (RF) unit and a baseband unit coupled to the at least one RF unit by the serial data link and wherein the integrated circuit for compressing the OFDM signal data is coupled to the at least one RF unit.

34. An integrated circuit device for decompressing a plurality of compressed coefficients received over a serial data link in a base transceiver system of a wireless communication network, the integrated circuit device comprising:
   a decoder to decode the plurality of compressed coefficients to form a plurality of reconstructed attenuated coefficients;
   an amplifier coupled to the decoder, the amplifier to increase a magnitude of at least one of the plurality of reconstructed attenuated coefficients in accordance with a gain profile to form a plurality of decompressed coefficients, wherein the gain profile corresponds to an attenuation profile associated with the plurality of compressed coefficients and the gain profile specifies gain levels corresponding to a plurality of frequency bins of the compressed coefficients;
   an OFDM inverse frequency domain transform unit coupled to the amplifier, the OFDM inverse frequency domain transform unit to compute an OFDM inverse frequency transform of the plurality of decompressed coefficients to generate a plurality of decompressed signal samples of the corresponding baseband channel, wherein a length of the OFDM inverse frequency domain transform is equal to a symbol length of the OFDM signal data; and
   logic to insert an OFDM cyclic prefix into the plurality of decompressed signal samples.

35. The integrated circuit device of claim 34, wherein the base transceiver system comprises at least one radio frequency (RF) unit and a baseband unit coupled to the at least one RF unit by the serial data link and wherein the integrated circuit for decompressing the plurality of compressed coefficients is coupled to the at least one RF unit.

36. In a base transceiver system of a wireless communication network, a method for compressing OFDM modulated signal data at a radio frequency (RF) unit for transfer to a baseband unit over a serial data link, wherein the RF unit is connected to an antenna to receive an analog signal, the analog signal representing a plurality of antenna-carrier channels, the RF unit including an analog to digital converter (ADC) that converts the analog signal to a digital signal and a digital down converter (DDC) that downconverts the digital signal to a plurality of baseband channels, each baseband channel corresponding to one of the antenna-carrier channels and having a sequence of signal samples, wherein each signal sample includes an in-phase (I) sample and a quadrature (Q) sample, wherein a baseband processor of the baseband unit performs signal processing operations, the method comprising:
   compressing the sequence of signal samples of each baseband channel at the RF unit, wherein for each baseband channel the compressing comprises:
      computing an OFDM frequency domain transform of a plurality of the sequence of signal samples of each baseband channel at the RF unit to form a plurality of frequency domain coefficients, wherein the frequency domain coefficients include a real component and an imaginary component for each of a plurality of frequency bins and wherein a length of the OFDM frequency domain transform is equal to a symbol length of the OFDM modulated signal data;
      attenuating one or more of the frequency domain coefficients in accordance with an attenuation profile to form a plurality of attenuated coefficients, wherein the attenuation profile specifies attenuation levels corresponding to the frequency bins; and
      encoding the attenuated coefficients to form compressed coefficients; and
   formatting the compressed coefficients of the plurality of baseband channels for transfer over the serial data link.

37. In a base transceiver system of a wireless communication network, a method for decompressing OFDM modulated signal data transferred from a baseband unit over a serial data link and received at a radio frequency (RF) unit, each signal sample associated with one of a plurality of baseband channels, wherein each signal sample includes an in-phase (I) sample and a quadrature (Q) sample, the RF unit including a digital up converter (DUC) that upconverts a sequence of signal samples of each baseband channel to a corresponding one of a plurality of antenna-carrier channels to form a single upconverted digital signal and a digital to analog converter (DAC) that converts the upconverted digital signal to an analog signal, wherein the RF unit is coupled to an antenna to transmit the analog signal, the analog signal representing the plurality of antenna-carrier channels, the method comprising:
   receiving a plurality of compressed coefficients at the RF unit; and
   decompressing the compressed coefficients at the RF unit, wherein for each baseband channel the decompressing comprises:
      decoding the compressed coefficients to form reconstructed attenuated coefficients;
      amplifying a plurality of the reconstructed attenuated coefficients in accordance with a gain profile to form a plurality of decompressed coefficients corresponding to each baseband channel, wherein the gain profile corresponds to the attenuation profile and specifies gain levels for corresponding frequency bins;
      computing an OFDM inverse frequency domain transform of the plurality of decompressed coefficients to form a plurality of decompressed signal samples of the corresponding baseband channel, wherein each decompressed signal sample includes a decompressed I sample and a decompressed Q sample, wherein a length of the OFDM inverse frequency domain transform is equal to a symbol length of the OFDM signal data; and providing the decompressed signal samples to the DUC for forming the upconverted digital signal.

\* \* \* \* \*